United States Patent
Wu et al.

(10) Patent No.: US 9,508,718 B2
(45) Date of Patent: Nov. 29, 2016

(54) FINFET CONTACT STRUCTURE AND METHOD FOR FORMING THE SAME

(71) Applicant: Taiwan Semiconductor Manufacturing Company, Ltd., Hsin-Chu (TW)

(72) Inventors: Ming-Yuan Wu, Hsin-Chu (TW); Yen-Po Lin, Taipei (TW); Yu-Shan Lu, Zhubei (TW); Che-Yuan Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/585,083

(22) Filed: Dec. 29, 2014

(65) Prior Publication Data

US 2016/0190133 A1    Jun. 30, 2016

(51) Int. Cl.
| | |
|---|---|
| *H01L 21/336* | (2006.01) |
| *H01L 27/092* | (2006.01) |
| *H01L 29/78* | (2006.01) |
| *H01L 29/08* | (2006.01) |
| *H01L 29/66* | (2006.01) |
| *H01L 21/306* | (2006.01) |
| *H01L 29/165* | (2006.01) |
| *H01L 29/06* | (2006.01) |
| *H01L 21/02* | (2006.01) |
| *H01L 21/265* | (2006.01) |
| *H01L 21/8238* | (2006.01) |

(52) U.S. Cl.
CPC ..... *H01L 27/0922* (2013.01); *H01L 21/02381* (2013.01); *H01L 21/02532* (2013.01); *H01L 21/26506* (2013.01); *H01L 21/30604* (2013.01); *H01L 21/823814* (2013.01); *H01L 21/823821* (2013.01); *H01L 21/823871* (2013.01); *H01L 29/0653* (2013.01); *H01L 29/0847* (2013.01); *H01L 29/165* (2013.01); *H01L 29/66636* (2013.01); *H01L 29/7848* (2013.01)

(58) Field of Classification Search
None
See application file for complete search history.

(56) References Cited

U.S. PATENT DOCUMENTS

| | | | | |
|---|---|---|---|---|
| 6,342,421 | B1* | 1/2002 | Mitani | H01L 21/02381 257/E21.106 |
| 7,932,136 | B2* | 4/2011 | Hua | H01L 29/1083 257/247 |
| 2003/0219954 | A1* | 11/2003 | Baba | H01L 21/76243 438/373 |
| 2007/0138570 | A1* | 6/2007 | Chong | H01L 21/82380 257/371 |
| 2013/0037822 | A1* | 2/2013 | Yin | H01L 21/26506 257/77 |

* cited by examiner

*Primary Examiner* — Reema Patel
(74) *Attorney, Agent, or Firm* — Slater Matsil, LLP

(57) ABSTRACT

A device comprises a substrate comprising a first portion and a second portion separated by an isolation region, a first gate structure over the first portion, a first drain/source region and a second drain/source region in the first portion and on opposite sides of the first gate structure, wherein the first drain/source region and the second drain/source have concave surfaces, a second gate structure over the second portion and a third drain/source region and a fourth drain/source region in the second portion and on opposite sides of the second gate structure, wherein the third drain/source region and the fourth drain/source have the concave surfaces.

20 Claims, 35 Drawing Sheets

FINFET CONTACT STRUCTURE AND METHOD FOR FORMING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

In a complementary metal oxide semiconductor (CMOS) field effect transistor (FET), active regions include a drain, a source, a channel region connected between the drain and the source, and a gate on top of the channel to control the on and off state of the channel region. When the gate voltage is more than a threshold voltage, a conductive channel is established between the drain and the source. As a result, electrons or holes are allowed to move between the drain and source. On the other hand, when the gate voltage is less than the threshold voltage, ideally, the channel is cut off and there are no electrons or holes flowing between the drain and the source. However, as semiconductor devices keep shrinking, due to the short channel leakage effect, the gate cannot fully control the channel region, especially the portion of the channel region which is far away from the gate. As a consequence, after semiconductor devices are scaled into deep sub-30 nanometer dimensions, the corresponding short gate length of conventional planar transistors may lead to the inability of the gate to substantially turn off the channel region.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross sectional view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

The formation of fins of a FinFET may include recessing a substrate to form recesses, filling the recesses with a dielectric material, performing a chemical mechanical polish process to remove excess portions of the dielectric material above the fins, and recessing a top layer of the dielectric material, so that the remaining portions of the dielectric material in the recesses form shallow trench isolation (STI) regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
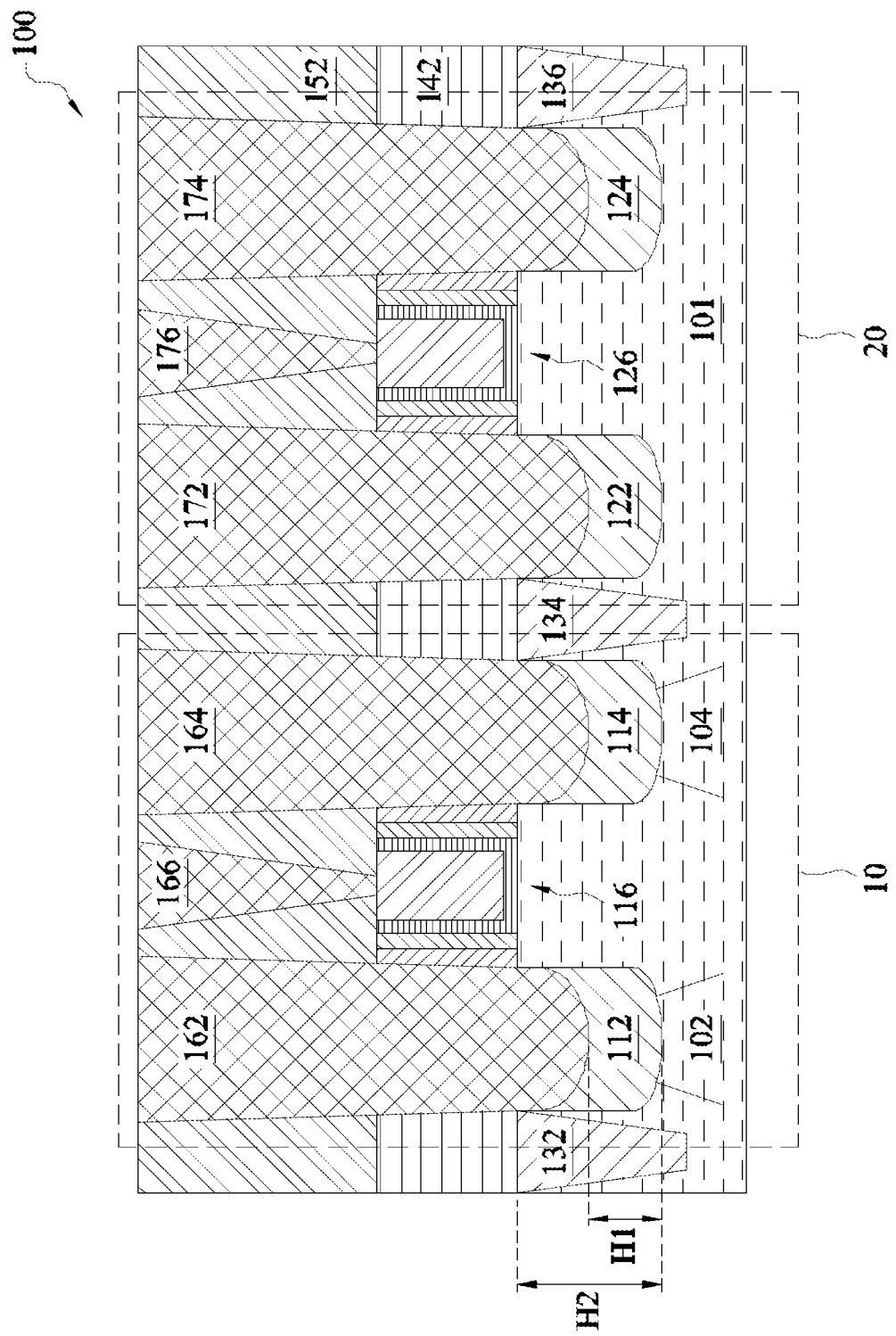
FIG. 1 illustrates a cross sectional view of a semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross sectional view of a semiconductor device in accordance with various embodiments of the present disclosure. The semiconductor device 100 includes two portions, namely a first portion 10 and a second portion 20. As shown in FIG. 1, the substrate portion of the first portion 10 is formed between a first isolation region 132 and a second isolation region 134. Likewise, the substrate portion of the second portion 20 is formed between the second isolation region 134 and a third isolation region 136. In other words, the first portion 10 and the second portion 20 are separated by the second isolation region 134.

In some embodiments, the semiconductor device 100 comprises two FinFETs formed over a substrate 101. A first FinFET is an n-type FinFET formed in the first portion 10. The first FinFET comprises a first drain/source region 112, a second drain/source region 114 and a first gate structure 116. As shown in FIG. 1, the first gate structure 116 is formed in a first dielectric layer 142 over the substrate 101. The first drain/source region 112 and the second drain/source region 114 are on opposite sides of the first gate structure 116. There may be two dislocation planes 102 and 104 formed in the first portion 10. As shown in FIG. 1, a first dislocation plane 102 and a second dislocation plane 104 are underlying the first drain/source region 112 and the second drain/source region 114 respectively. The first dislocation plane 102 and a second dislocation plane 104 are employed to improve the electron mobility of the n-type FinFET. The detailed formation process of the first dislocation plane 102 and a second dislocation plane 104 will be discussed below with respect to FIGS. 3-30.

A second FinFET is a p-type FinFET formed in the second portion 20. The second FinFET comprises a third drain/source region 122, a fourth drain/source region 124 and a second gate structure 126. As shown in FIG. 1, the second gate structure 126 is formed in the first dielectric layer 142 over the substrate 101. The third drain/source region 122 and the fourth drain/source region 124 are on opposite sides of the second gate structure 126. Throughout the description, the second portion 20 shown in FIG. 1 may be alternatively referred to as a PMOS region 20 since the p-type FinFET is formed in the second portion 20. Likewise, the first portion 10 shown in FIG. 1 may be alternatively referred to as an NMOS region 10.

As shown in FIG. 1, the first drain/source region 112, the second drain/source region 114, the third drain/source region 122 and the fourth drain/source region 124 have concave surfaces. For example, the top surface of the first drain/source region 112 is a concave surface. In other words, a recess is over the top surface of the first drain/source region 112. IN some embodiments, the recess is advantageously formed in a middle-of-the-line (MEOL) or back-end-of-the-line (BEOL) process, rather than a front-end-of-the-line (FEOL) process, also to be described below with respect to FIGS. 3-30.

The distance between the lowest point of the recess and the bottom surface of the first drain/source region 112 is defined as H1 as shown in FIG. 1. Likewise, the distance between the highest point of the recess and the bottom surface of the first drain/source region 112 is defined as H2 as shown in FIG. 1. The difference between H2 and H1 is in a range from about 5 nm to about 25 nm.

It should be noted that while FIG. 1 shows the semiconductor device 100 includes two transistors, this is merely an example. One skilled in the art will recognize there may be many modifications, alternatives and variations. For example, the semiconductor device 100 may accommodate any number of transistors and/or FinFET transistors depending on different applications and design needs.

The semiconductor device 100 may further comprise a plurality of silicide regions (not shown) formed over their respective drain/source regions, contact etching stop layers (not shown) formed over the substrate 101 and contact plugs.

As shown in FIG. 1, there may be two gate contacts 166 and 176 formed in a second dielectric layer 152. The bottoms of the gate contacts 166 and 176 are in direct contact with top surfaces of the structures 116 and 126 respectively. Drain/source contacts 162, 164 172 and 174 are electrically coupled to their respective drain/source regions as shown in FIG. 1. More particularly, a lower portion of each drain/source contact is formed in a recess. For example, the lower portion of the drain/source contact 162 is formed in the recess over the first drain/source region 112. The concave surface of the recess helps to increase the landing area of the drain/source contact 162 so as to reduce the contact resistance of the drain/source contact 162. As such, the performance of the semiconductor device 100 may be improved accordingly. The detailed formation processes of the drain/source contacts 162, 164, 172 and 174 will be described below with respect to FIGS. 3-30.

Figure 2:
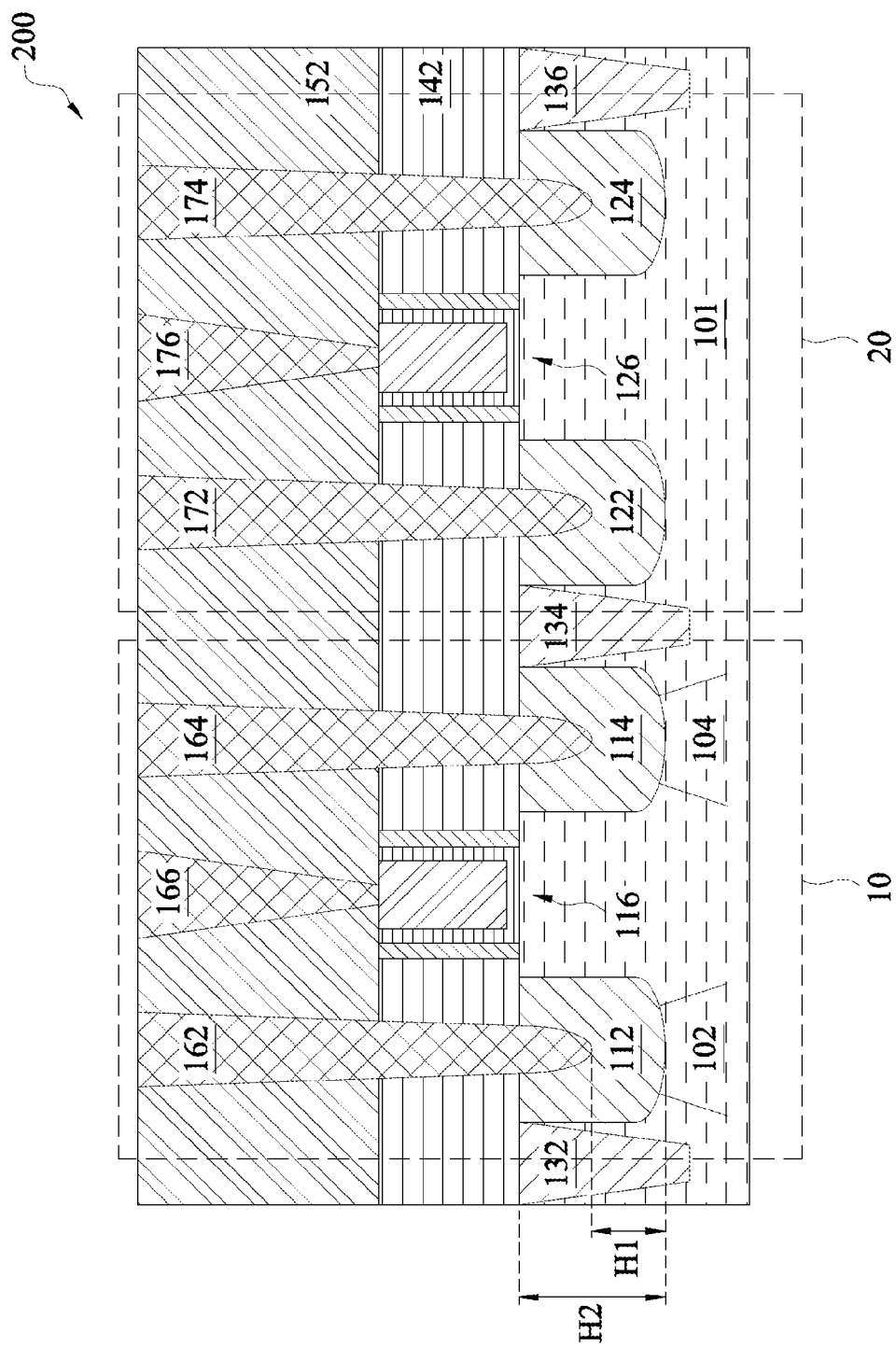
FIG. 2 illustrates a cross sectional view of another semiconductor device in accordance with various embodiments of the present disclosure.

FIG. 2 illustrates a cross sectional view of another semiconductor device in accordance with various embodiments of the present disclosure. The semiconductor device 200 shown in FIG. 2 is similar to the semiconductor device 100 shown in FIG. 1 except that the recesses in the drain/source regions 112, 114, 122 and 124 of FIG. 2 are smaller than those shown in FIG. 1. For example, the recess in the first drain/source region 112 of FIG. 2 is only in the middle portion of the first drain/source region 112. As a result, the edge portions of the top surface of the first drain/source region 122 are planar as shown in FIG. 2. In some embodiments, the recess in the first drain/source region 112 of FIG. 2 may occupy about 50% of the top surface of the first drain/source region 112. The formation process of the semiconductor device 200 is similar to that of the semiconductor device 100, and hence is not discussed herein.

FIGS. 3-30 are cross-sectional views of intermediate stages in the manufacturing of the semiconductor device shown in FIG. 1 in accordance with various embodiments of the present disclosure. The semiconductor fabrication process shown in FIGS. 3-30 is based upon a dual epitaxial process. The dual epitaxial process includes epitaxially growing a silicon layer in source and drain regions of an n-type transistor and epitaxially growing a silicon germanium layer (SiGe) in source and drain regions of a p-type transistor. The semiconductor fabrication process shown in FIGS. 3-30 is merely an example, which should not unduly limit the scope of the claims. One of ordinary skill in the art would recognize many variations, alternatives, and modifications.

Figure 3:
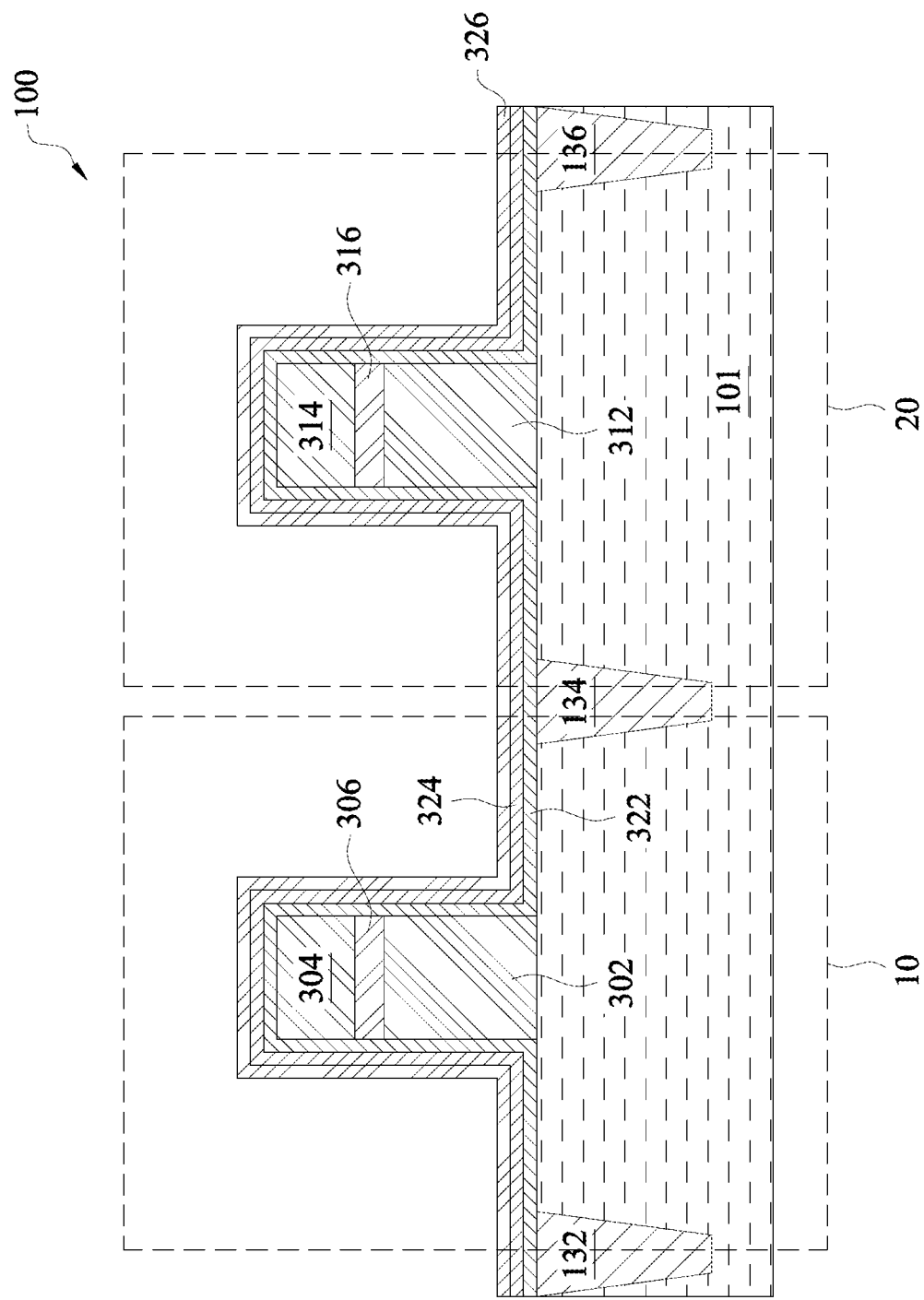
FIGS. 3-30 are cross-sectional views of intermediate stages in the manufacturing of the semiconductor device shown in FIG. 1 in accordance with various embodiments of the present disclosure.

FIG. 3 illustrates a cross sectional view of a semiconductor device including two gate structures over a substrate in accordance with various embodiments of the present disclosure. The gate structures may comprise two dummy gate electrodes 302 and 312 over the substrate 101. There may be thin oxide layers 306 and 316 formed over the dummy gate electrodes 302 and 312 respectively. Furthermore, two hard mask layers 304 and 314 are formed over the thin oxide layers 306 and 316 respectively.

The semiconductor device 100 may comprise a plurality of protection dielectric layers over the gate structures and the substrate 101. As shown in FIG. 3, a first protection dielectric layer 322, a second protection dielectric layer 324 and a third protection dielectric layer 326 are formed along sidewalls and top surfaces of the gate structures. In some embodiments, the first protection dielectric layer 322 and the second protection dielectric layer 324 may function as a gate spacer layer.

In some embodiments, the first protection dielectric layer 322 and the second protection dielectric layer 324 are formed of suitable dielectric materials such as a silicon nitride layer doped with carbon (SiCN) and/or the like. The carbon concentration may be in a range from about 1% to about 50%. The thickness of the first protection dielectric layer 322 and the second protection dielectric layer 324 is about 30 Angstroms. The first protection dielectric layer 322 and the second protection dielectric layer 324 may be formed by suitable deposition techniques such as atomic layer deposition (ALD) and/or the like.

In some embodiments, the third protection dielectric layer 326 is formed of suitable dielectric materials such as silicon nitride (SiN) and/or the like. The thickness of the third protection dielectric layer 326 is about 40 Angstroms. The third protection dielectric layer 326 may be formed by suitable deposition techniques such as ALD and/or the like.

The substrate 101 may be formed of silicon. Other commonly used materials, such as carbon, germanium, gallium, arsenic, nitrogen, indium, phosphorus and/or the like, may also be included in the substrate 101. The substrate 101 may be a bulk substrate or a semiconductor-on-insulator (SOI) substrate.

The dummy gate electrodes 302 and 312 may be formed of suitable gate electrode materials such as polysilicon, although other materials may also be used. The thin oxide layers 306 and 316 may be thermally grown on the top surfaces of the dummy gate electrodes 302 and 312 respectively. The hard mask layers 304 and 314 may be formed of silicon nitride or the like. The hard mask layers 304 and 314 may be deposited over the dummy gate electrodes 302 and 312 through suitable deposition techniques.

It should be noted dummy gate dielectric layers (not shown) may be formed between the dummy gate electrodes 302 and 312, and the substrate 101. The dummy gate dielectric layers may be formed of silicon oxide, silicon nitride, a combination thereof and/or the like. The dummy gate dielectric layers may be deposited or thermally grown according to acceptable semiconductor fabrication techniques.

It should further be noted lightly doped drain/source (LDD) regions (not shown) may be formed in the semiconductor device 100. First, a mask may be formed over the PMOS region of the semiconductor device 100 while exposing the NMOS region, and n-type dopants may be implanted into the NMOS region 10. The mask may be removed after the n-type implantation. Subsequently, a mask may be formed over the NMOS region of the semiconductor device 100 while exposing the PMOS region, and p-type dopants may be implanted into the exposed PMOS region. The mask may be removed subsequently. An annealing process may be employed to increase the implantation depths of the p-type dopants and the n-type dopants.

FIG. 3 further illustrates there may be three isolation regions 132, 134 and 136 formed in the substrate 101. The isolation regions 132, 134 and 136 may be implemented by a shallow trench isolation (STI) structure. The STI structure (e.g., isolation region 132) may be fabricated by using suitable techniques including photolithography and etching processes. In particular, the photolithography and etching processes may comprise depositing a commonly used mask material such as photoresist over the substrate 101, exposing the mask material to a pattern, etching the substrate 101 in accordance with the pattern. In this manner, a plurality of openings (not shown) may be formed as a result.

The openings are then filled with dielectric materials to form the STI structures (e.g., isolation regions 132). In accordance with an embodiment, the isolation regions may be filled with a dielectric material such as an oxide material, a high-density plasma (HDP) oxide or the like. Alternatively, the dielectric material may be formed of materials selected from the group consisting of silicon oxide, silicon nitride, silicon carbon nitride, silicon oxy-carbon nitride and any combinations thereof. The dielectric material may be deposited through suitable deposition techniques such as chemical vapor deposition (CVD), sub-atmospheric CVD (SACVD), high density plasma CVD (HDPCVD) and/or the like. A chemical mechanical polishing (CMP) process is then applied to the portion of the dielectric material over the top surface of the substrate 101. As a result, excess portions of the dielectric material have been removed. The remaining portions of the dielectric material are the isolation regions 132, 134 and 136 as shown in FIG. 3.

As shown in FIG. 3, the isolation regions 132, 134 and 136 may be portions of a continuous region, which may form an isolation ring in accordance with an embodiment. Alternatively, the isolation regions 132, 134 and 136 may be three separate isolation regions having their sidewalls facing each other.

Figure 4:
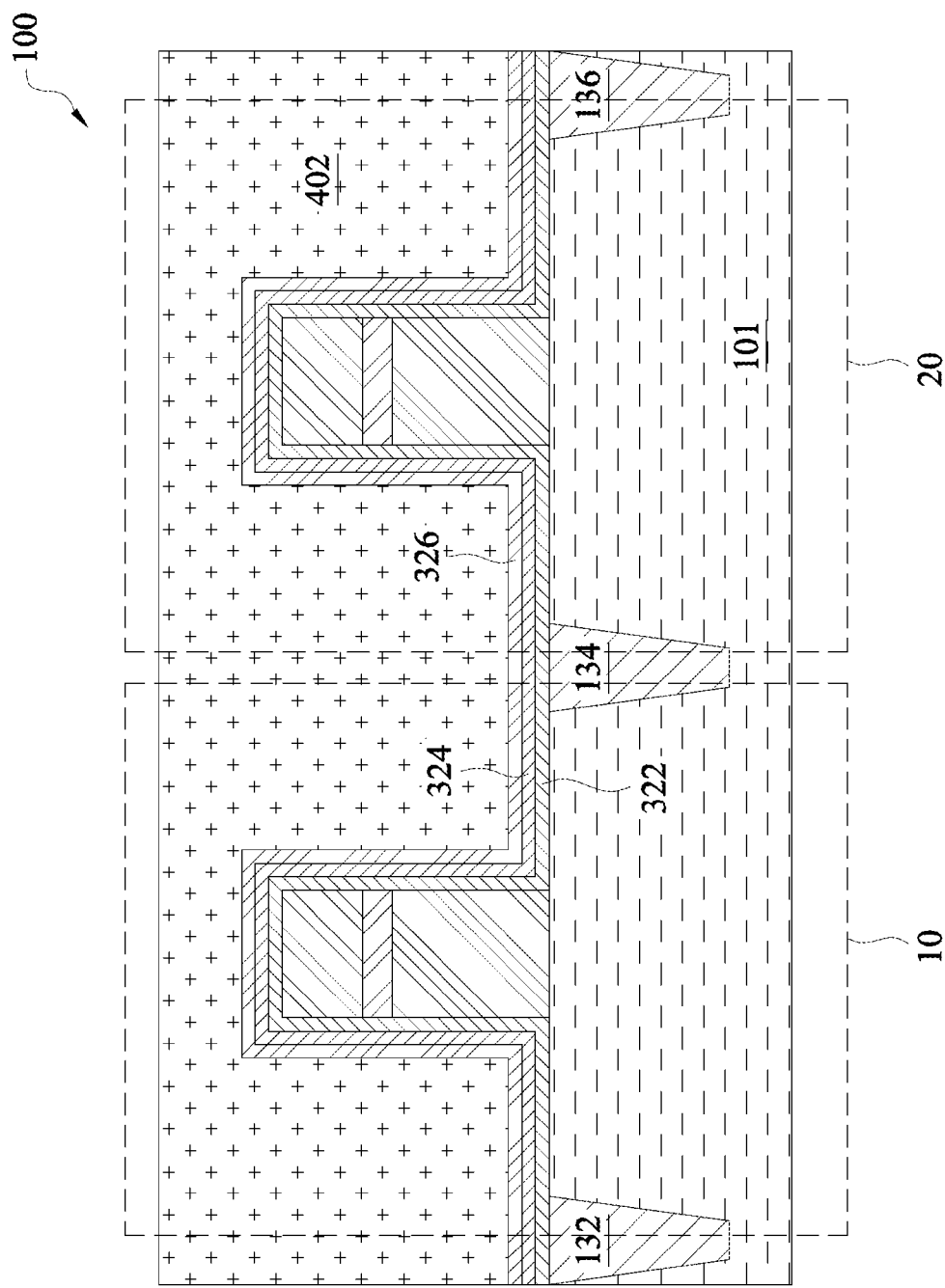

FIG. 4 illustrates a cross sectional view of the semiconductor device shown in FIG. 3 after a photoresist layer is formed over the semiconductor device in accordance with various embodiments of the present disclosure. The photoresist layer 402 is deposited over the semiconductor device 100. More particularly, the gate structures are embedded in the photoresist layer 402 as shown in FIG. 4.

Figure 5:
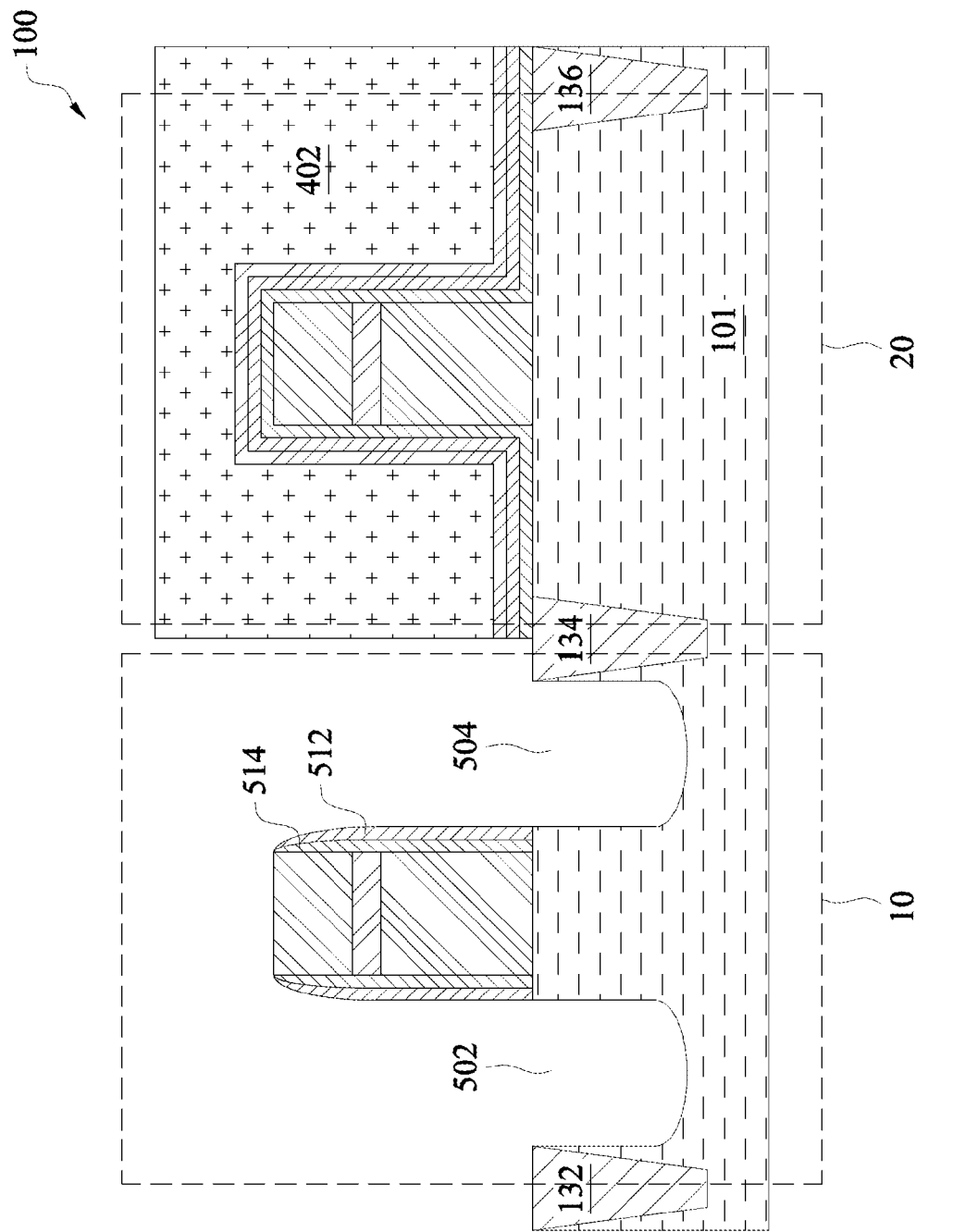

FIG. 5 illustrates a cross sectional view of the semiconductor device shown in FIG. 4 after a patterning process is applied to the photoresist layer in accordance with various embodiments of the present disclosure. The photoresist layer 402 is patterned according to the shape of the NMOS region 10 of the semiconductor device 100. More particularly, the photoresist layer 402 may be exposed and developed as part of a suitable photolithography process. After the photolithography process finishes, the portion of the photoresist layer 402 in the NMOS region 10 has been removed as shown in FIG. 5. The patterned photoresist layer 402 shown in FIG. 5 is used to protect the PMOS region 20 of the semiconductor device 100 during the subsequent etching processes.

The exposed portion of the third protection dielectric layer 326 may be removed by suitable etching process. The horizontal portion of the gate spacer layer (e.g., protection dielectric layers 322 and 324) shown in FIG. 4 may be removed to form gate spacers including a first dielectric portion 512 and a second dielectric portion 514. The patterning may be performed by suitable etching processes such as wet etching, dry etching and/or the like.

A first drain/source trench 502 and a second drain/source trench 504 may be formed by any suitable semiconductor patterning techniques such as an etching process and/or the like. In some embodiments, the exposed portion of the substrate 101 may be removed to form the first drain/source trench 502 and the second drain/source trench 504 as shown in FIG. 5.

Figure 6:
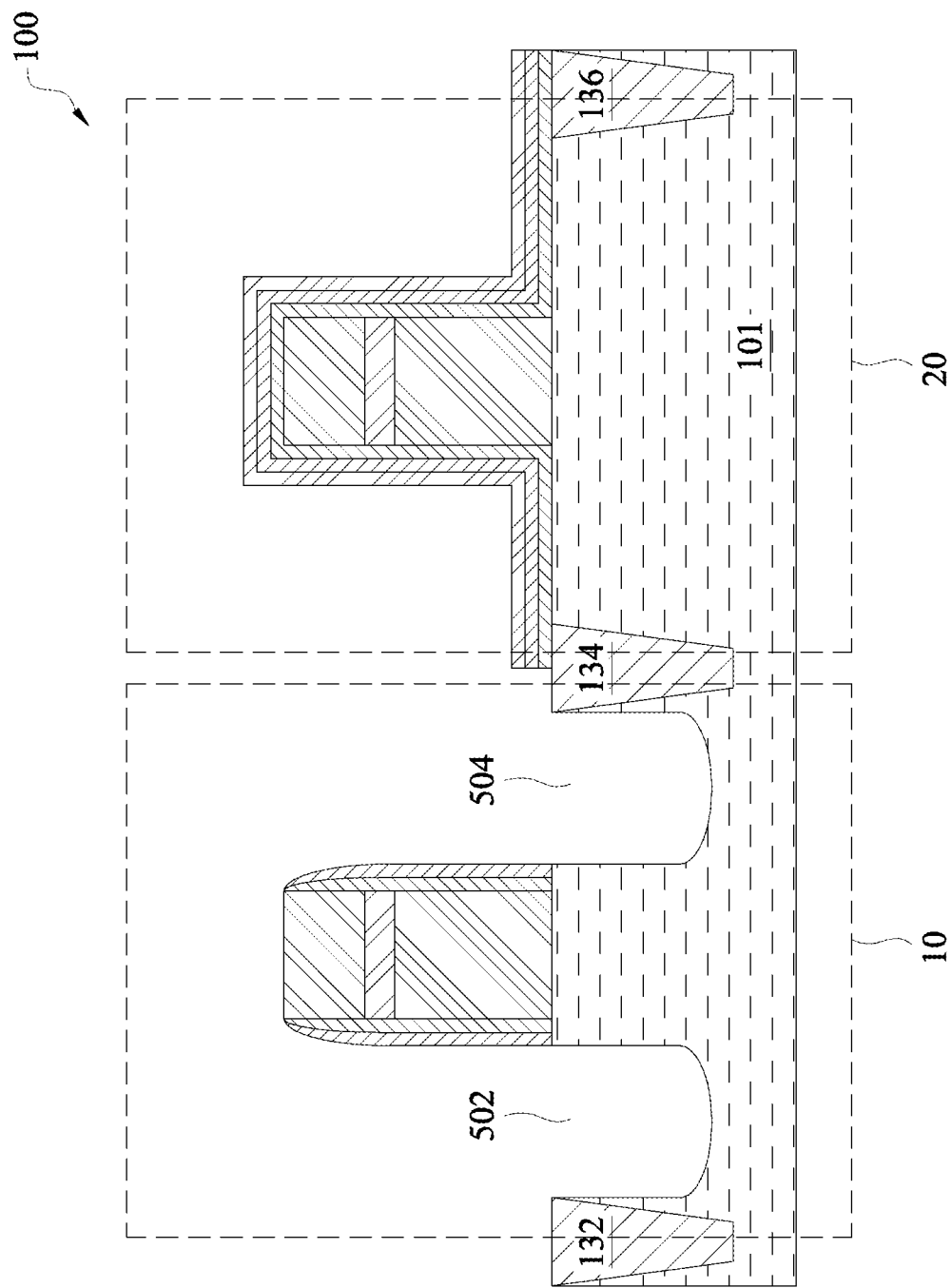

FIG. 6 illustrates a cross sectional view of the semiconductor device shown in FIG. 5 after the remaining photoresist layer has been removed in accordance with various embodiments of the present disclosure. The remaining photoresist layer shown in FIG. 5 may be removed by using suitable photoresist stripping techniques such as chemical solvent cleaning, plasma ashing, dry stripping and/or the like. The photoresist stripping techniques are well known and hence are not discussed in further detail herein to avoid repetition.

Figure 7:
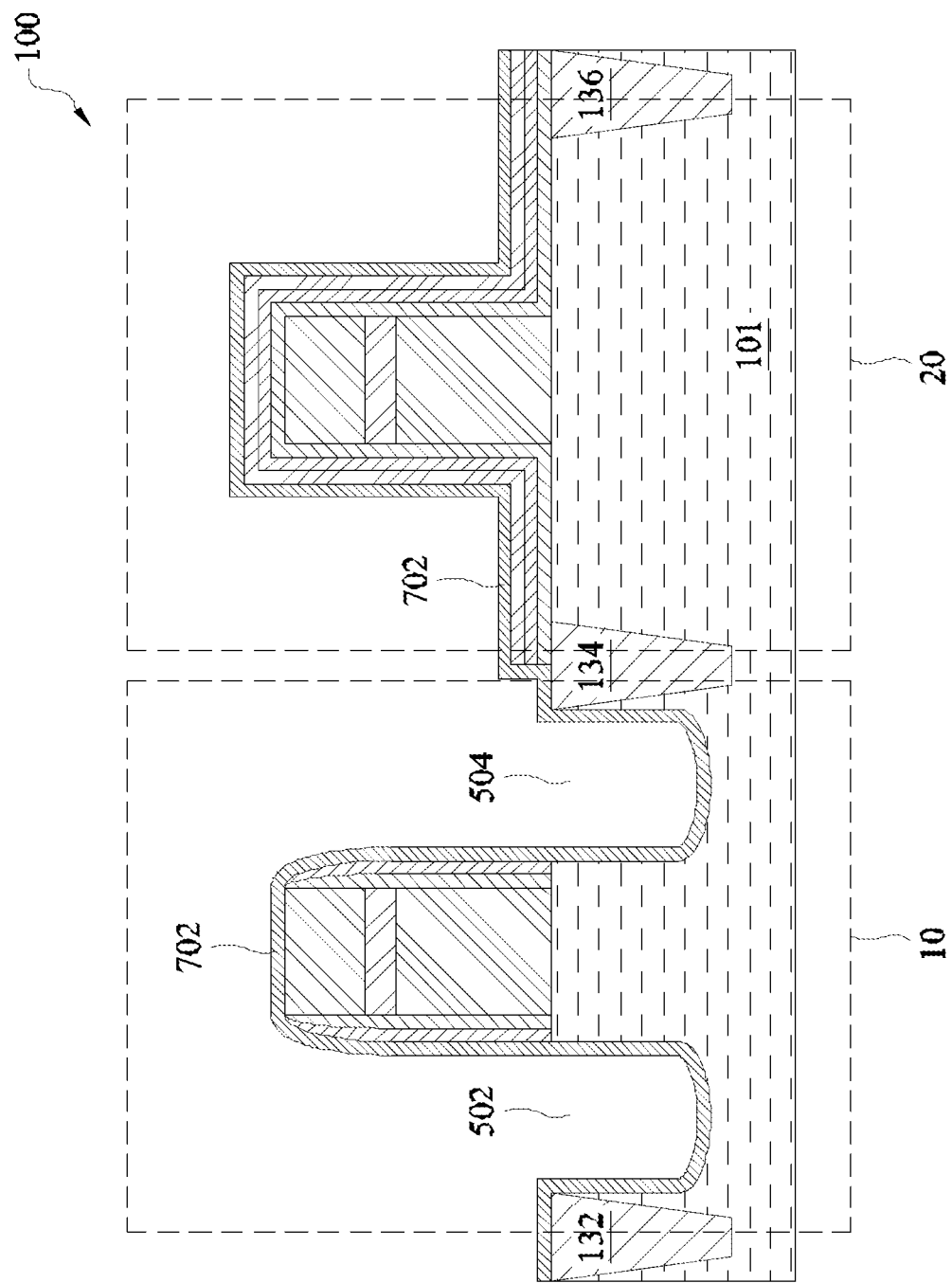

FIG. 7 illustrates a cross sectional view of the semiconductor device shown in FIG. 6 after an oxide layer is formed over the semiconductor device in accordance with various embodiments of the present disclosure. The oxide layer 702 may be formed of suitable dielectric materials such as silicon oxide and/or the like. The oxide layer 702 may be deposited or thermally grown according to acceptable semiconductor fabrication techniques such as CVD and/or the like.

Figure 8:
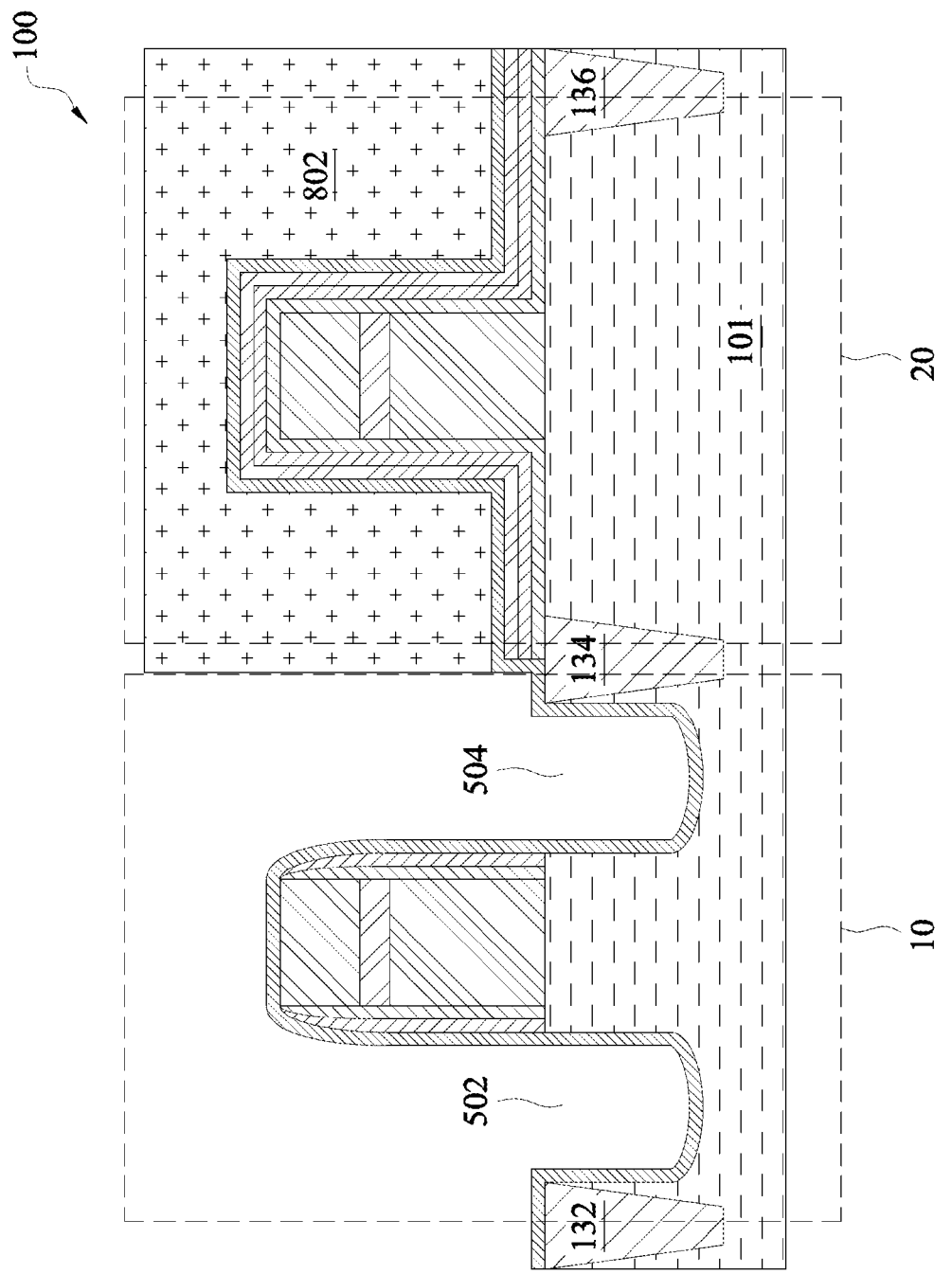

FIG. 8 illustrates a cross sectional view of the semiconductor device shown in FIG. 7 after a photoresist layer is formed over the semiconductor device in accordance with various embodiments of the present disclosure. The photoresist layer 802 is deposited over the semiconductor device 100. The photoresist layer 802 is patterned according to the location and shape of the NMOS region 10 of the semiconductor device 100. More particularly, the photoresist layer 802 may be exposed and developed as part of a suitable photolithography process. After the photolithography process finishes, the portion of the photoresist layer 802 in the NMOS region 10 has been removed as shown in FIG. 8.

Figure 9:
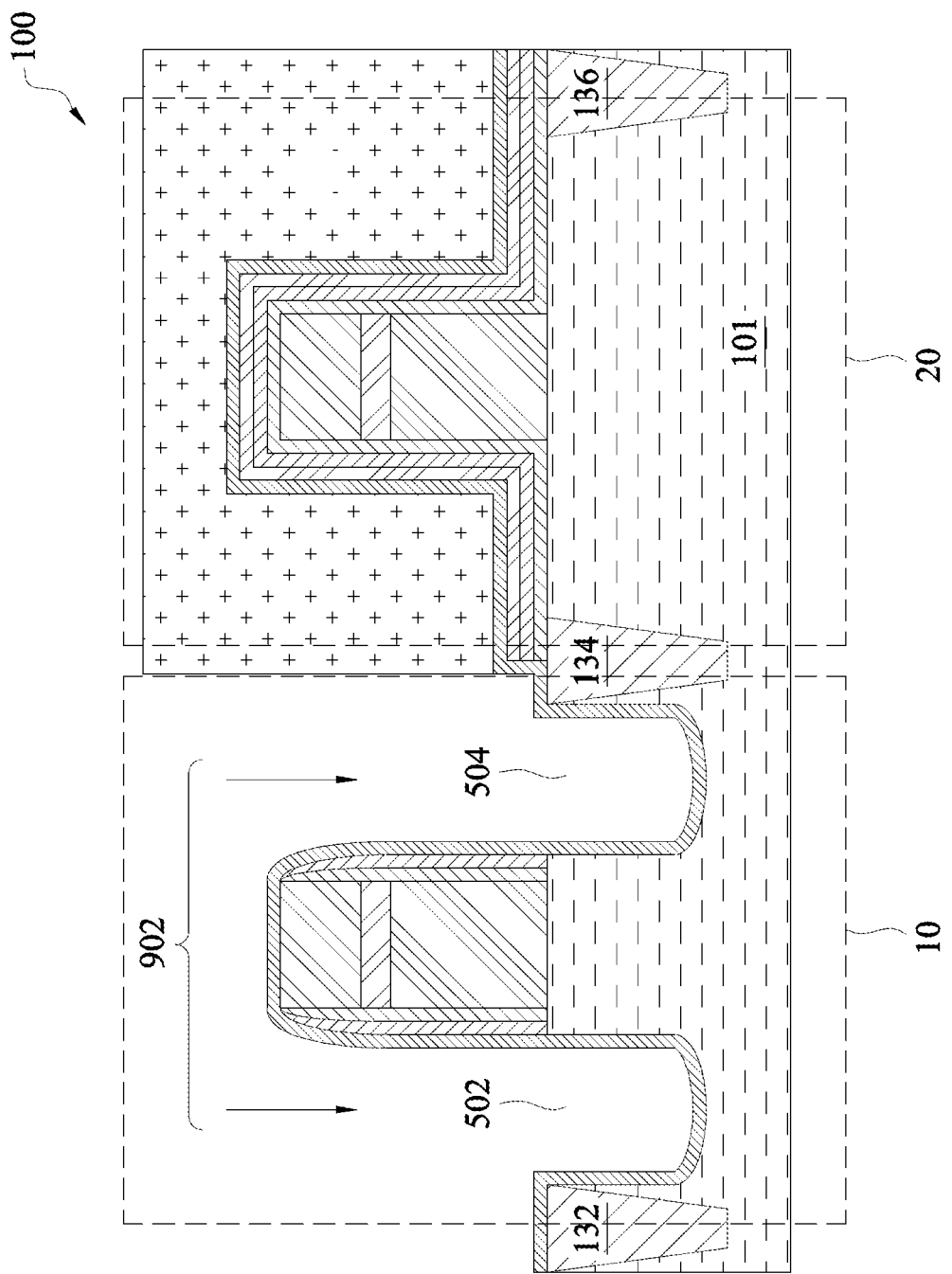

FIG. 9 illustrates a cross sectional view of the semiconductor device shown in FIG. 8 after a first pre-amorphous implantation (PAI) process is applied to the semiconductor device in accordance with various embodiments of the present disclosure. As indicated by arrows 902, suitable semiconductor materials such as germanium, silicon and/or the like are implanted to convert the crystal structure of the substrate 101 under the first drain/source trench 502 and the second drain/source trench 504 into a plurality of structurally amorphous structures (not shown). Throughout the description, the region having an amorphous state is alternatively referred to as a PAI region.

In some embodiments, the energy of the first PAI process is in a range from about 15 KeV to about 25 KeV. The implantation dosage of the first PAI process is in a range from about $1E21/cm^2$ to about $4E21/cm^2$. The first PAI process may be performed at a temperature in a range from about −60 degrees to about −100 degrees.

Figure 10:
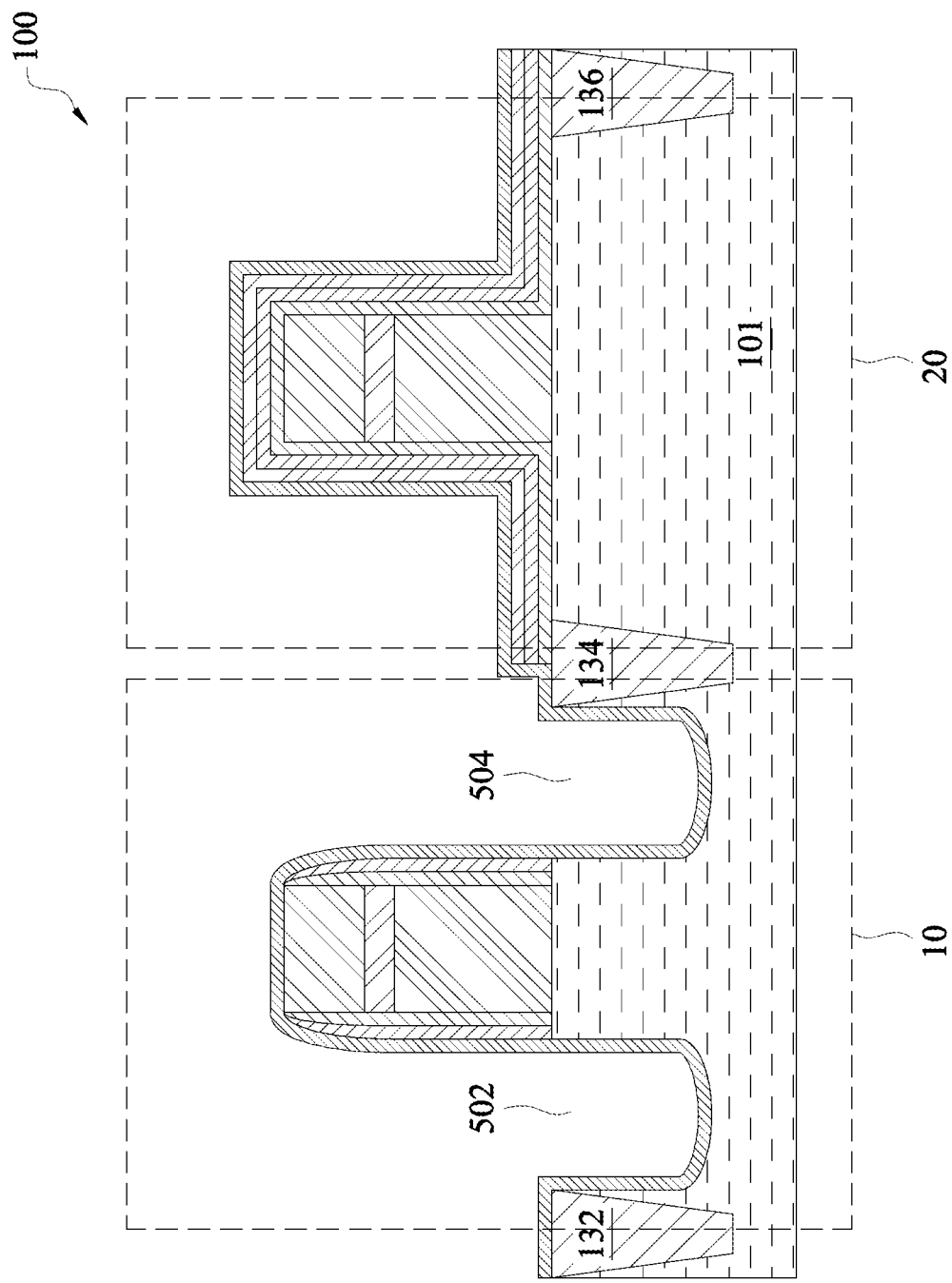

FIG. 10 illustrates a cross sectional view of the semiconductor device shown in FIG. 9 after the remaining photoresist layer has been removed in accordance with various embodiments of the present disclosure. The remaining photoresist layer shown in FIG. 9 may be removed by using suitable photoresist stripping techniques such as chemical solvent cleaning, plasma ashing, dry stripping and/or the like. The photoresist stripping techniques are well known and hence are not discussed in further detail herein to avoid repetition.

Figure 11:
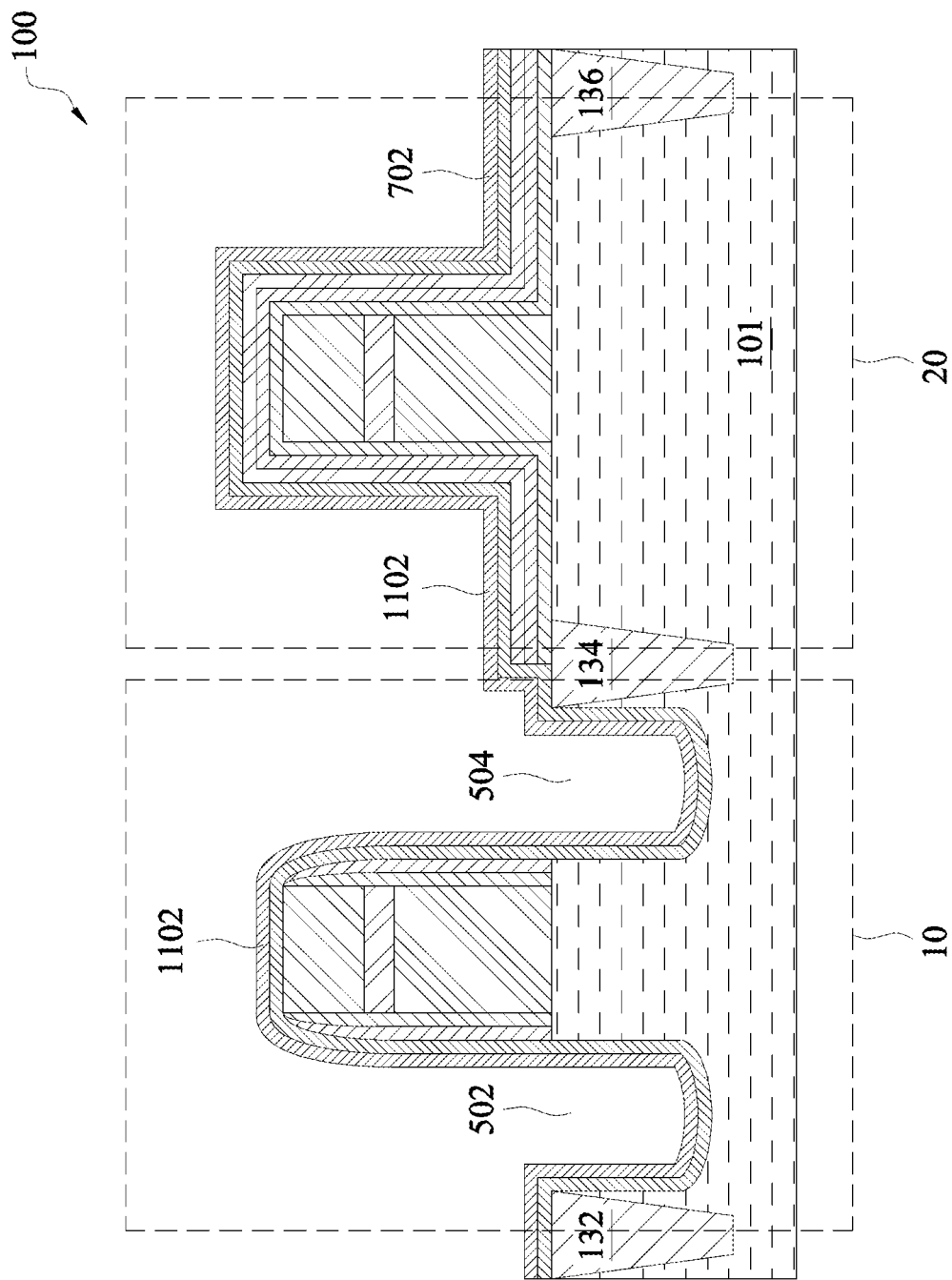

FIG. 11 illustrates a cross sectional view of the semiconductor device shown in FIG. 10 after a tensile film layer is formed over the oxide layer in accordance with various embodiments of the present disclosure. The tensile film layer 1102 is formed over the oxide layer 702 through suitable semiconductor deposition processes. In some embodiments, the tensile film layer 1102 is formed of suitable semiconductor materials having intrinsic tensile stresses. For example, the tensile film layer 1102 may be formed of nitride materials such as silicon nitride, titanium nitride and/or the like. Alternatively, the tensile film layer may be formed of suitable oxide materials. In some embodiments, the thickness of the tensile film layer 1102 is about 100 Angstroms.

It should be noted while FIG. 11 illustrates a single tensile film layer (e.g., the tensile film layer 1102), one of ordinary skill in the art would recognize many variations, alternatives, and modifications. For example, a multi-layer tensile film layer may also be used in some embodiments.

Figure 12:
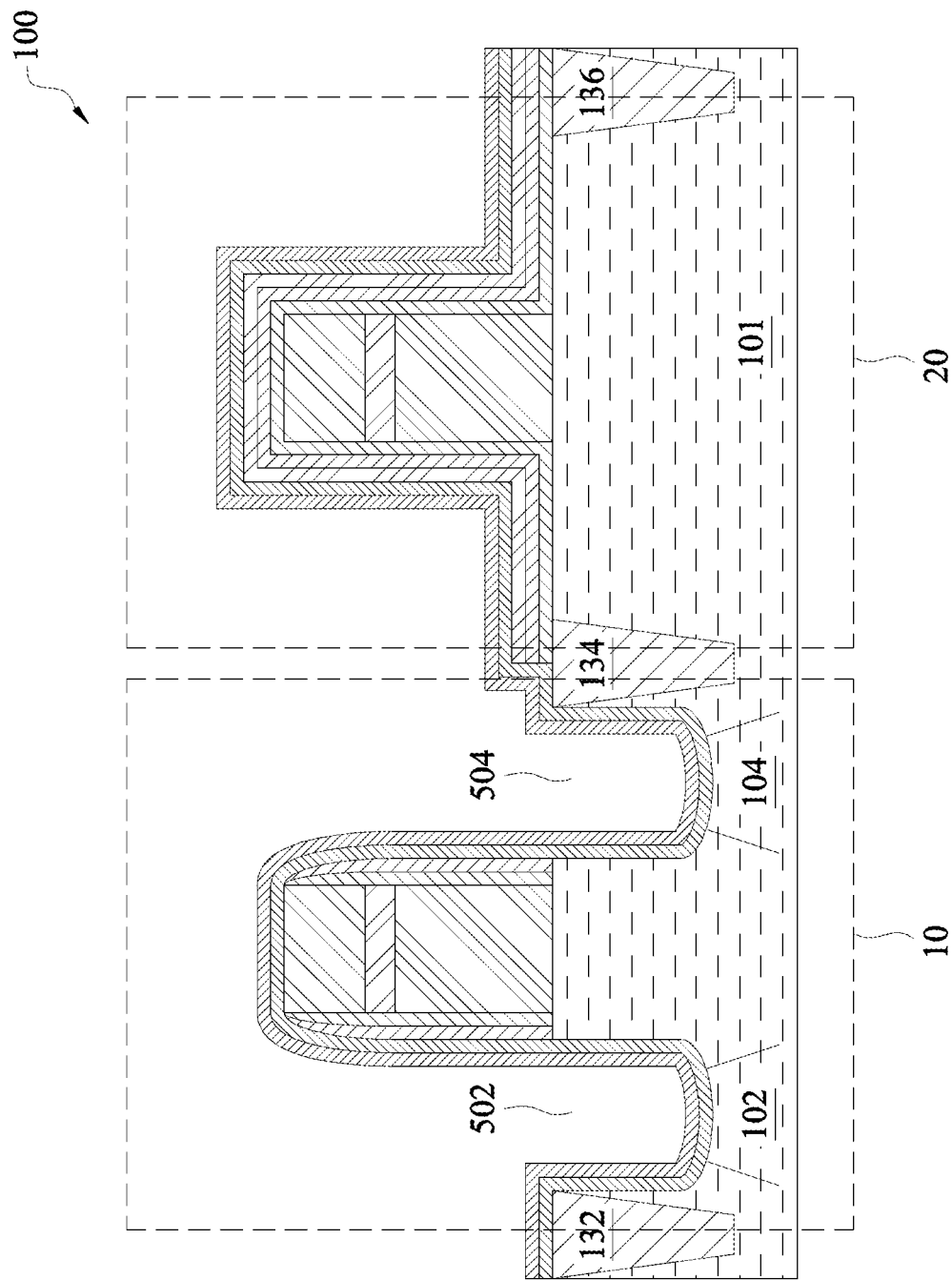

FIG. 12 illustrates a cross sectional view of the semiconductor device shown in FIG. 11 after a first anneal process is applied to the semiconductor device in accordance with various embodiments of the present disclosure. The first anneal process is employed to form dislocation planes 102 and 104. During the anneal process, tensile stresses from the substrate 101 and the tensile film (e.g., tensile film layer 1102) are applied to the channel regions so as to improve the electron mobility. As a result, the performance of the n-type FinFET in the NMOS region 10 is improved.

In some embodiments, the first anneal process is implemented as suitable thermal processes such as a rapid thermal anneal process and/or the like. The temperature of the first anneal process is in a range from about 500 degrees to about 700 degrees. The duration of the first anneal process is in a range from about one minute to about six minutes.

As shown in FIG. 12, the dislocation planes 102 and 104 are formed under the first drain/source trench 502 and the second drain/source trench 504 respectively. In some embodiments, the dislocation planes 102 and 104 are parallel to each other.

Figure 13:
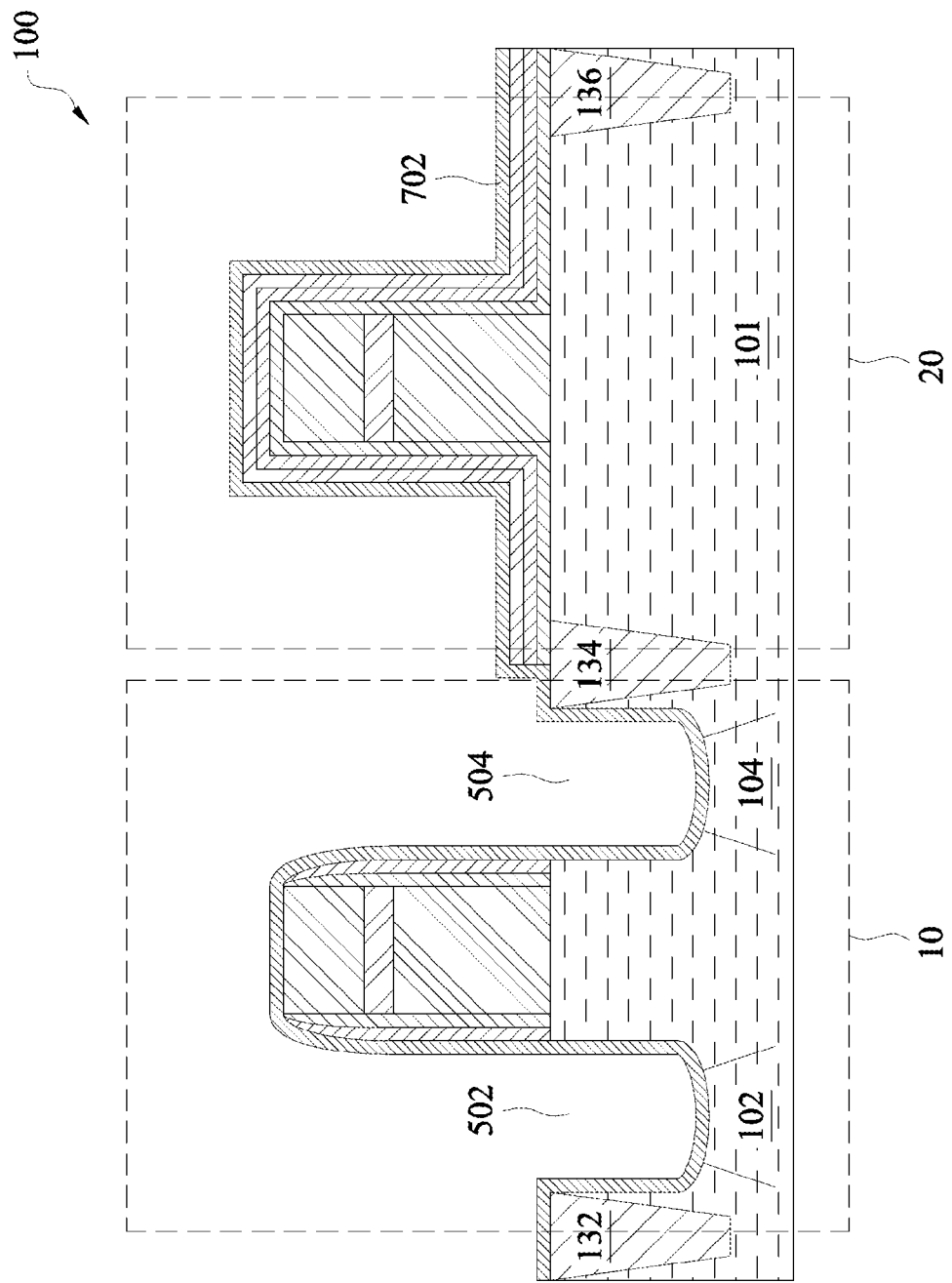

FIG. 13 illustrates a cross sectional view of a semiconductor device shown in FIG. 12 after a tensile film removal process has been applied to the semiconductor device in accordance with various embodiments of the present disclosure. The tensile film layer 1102 shown in FIG. 12 may be removed by suitable etching processes such as a dry etching process, a wet etching process and any combinations thereof.

Figure 14:
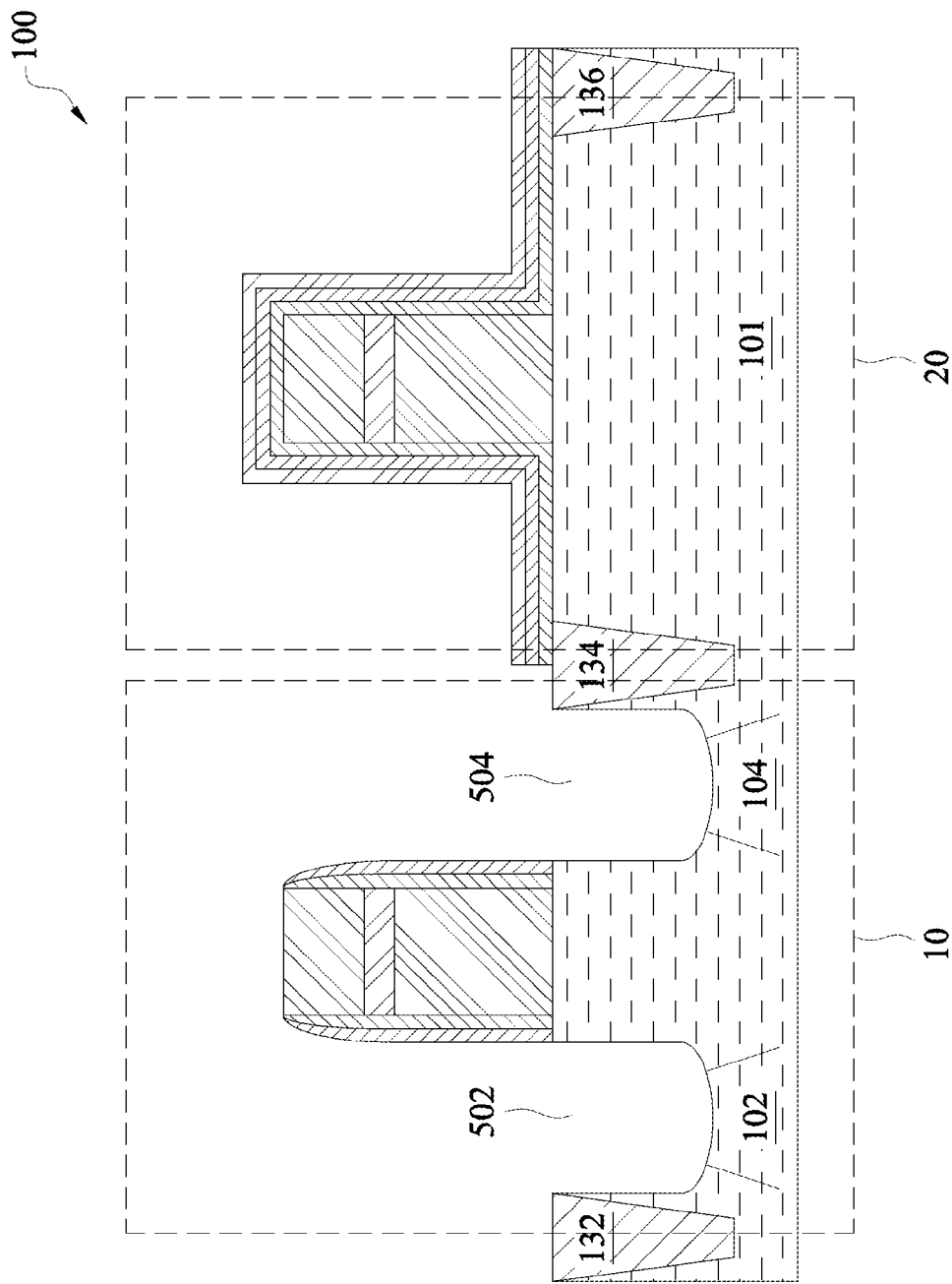

FIG. 14 illustrates a cross sectional view of a semiconductor device shown in FIG. 13 after an oxide removal process has been applied to the semiconductor device in accordance with various embodiments of the present disclosure. The oxide layer 702 shown in FIG. 13 may be removed by suitable etching processes such as a dry etching process, a wet etching process and any combinations thereof.

Figure 15:
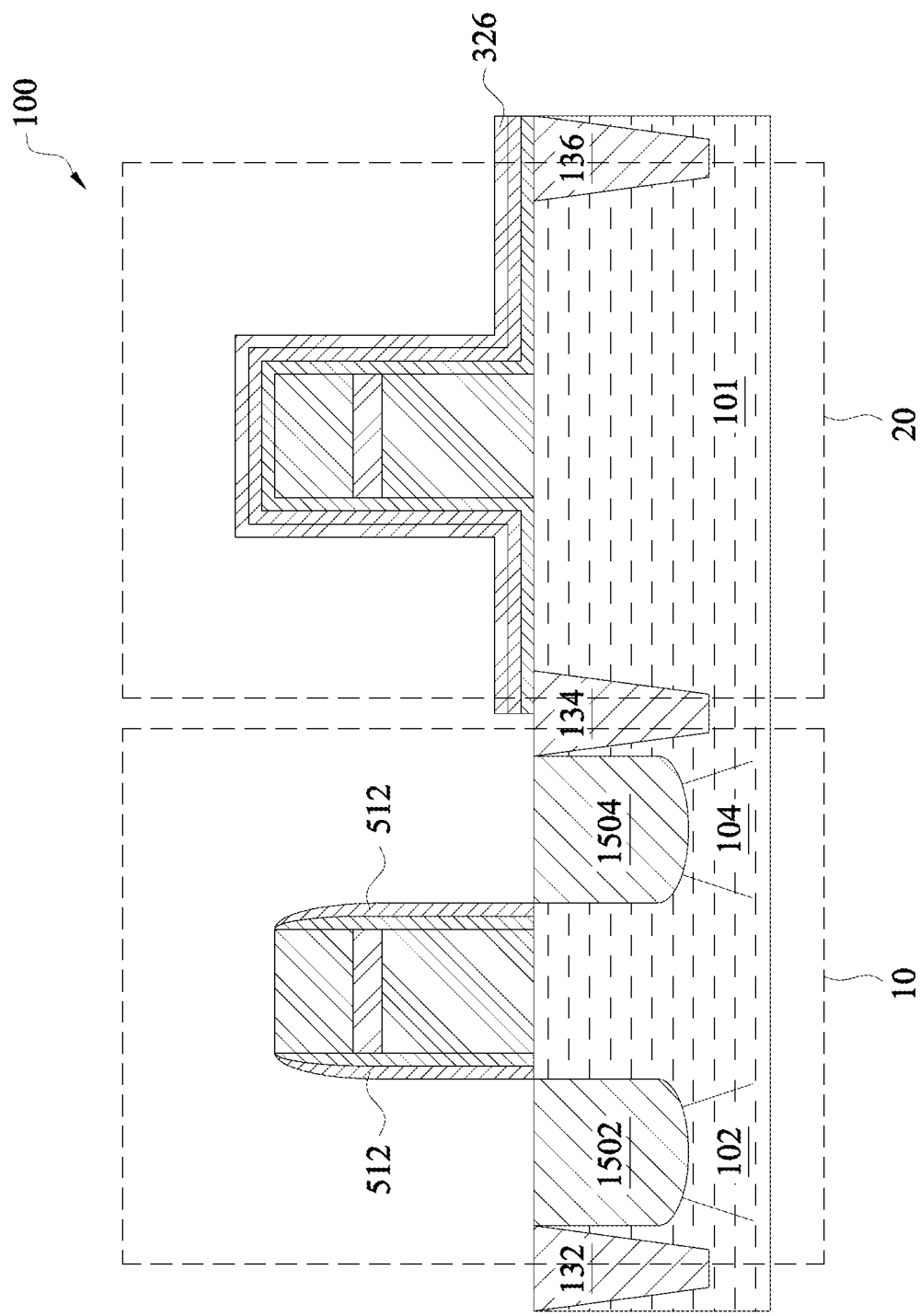

FIG. 15 illustrates a cross sectional view of the semiconductor device shown in FIG. 14 after an epitaxial growth process is applied to the semiconductor device in accordance with various embodiments of the present disclosure. Prior to the epitaxial growth process, a pre-cleaning process may be employed to remove any native oxides or any other contaminants from the surfaces of the first drain/source trench 502 and the second drain/source trench 504. The pre-cleaning process may be a dry chemical cleaning process such as SiCoNi pre-cleaning processes and/or the like.

In some embodiments, the drain/source regions 1502 and 1504 may comprise a suitable semiconductor material to induce a performance enhancement effect such as strained drain/source features. In some embodiments, the drain/source regions 1502 and 1504 may comprise a silicon epitaxial material. The drain/source regions 1502 and 1504 may be epitaxially grown in the first drain/source trench 502 and the second drain/source trench 504. The drain/source regions 1502 and 1504 may be in-situ doped during the epitaxial growth process. In some embodiments, the drain/source regions 1502 and 1504 may be doped with phosphorous to form their corresponding SiP regions.

As shown in FIG. 15, after the epitaxial process finishes, the drain/source regions 1502 and 1504 are adjacent to the spacer 512. More particularly, the drain/source regions 1502 and 1504 are aligned with the edges of the spacer 512. Furthermore, as shown in FIG. 15, the drain/source region 1502 is over the dislocation plane 102. Likewise, the drain/source region 1504 is over the dislocation plane 104.

Figure 16:
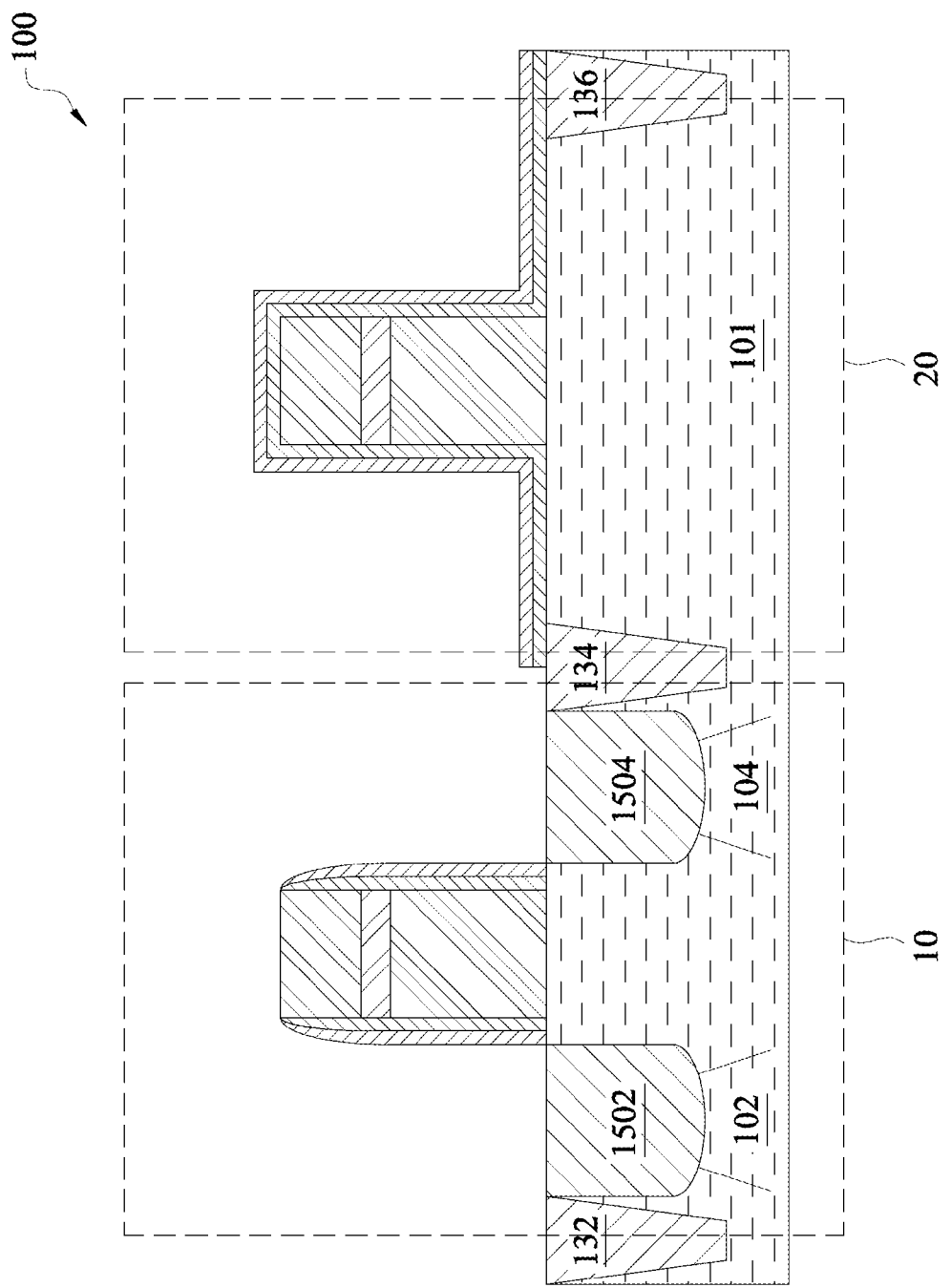

FIG. 16 illustrates a cross sectional view of a semiconductor device shown in FIG. 15 after a silicon nitride removal process has been applied to the semiconductor device in accordance with various embodiments of the present disclosure. The third protection dielectric layer 326 shown in FIG. 15 may be removed by suitable etching processes such as a dry etching process, a wet etching process and any combinations thereof.

Figure 17:
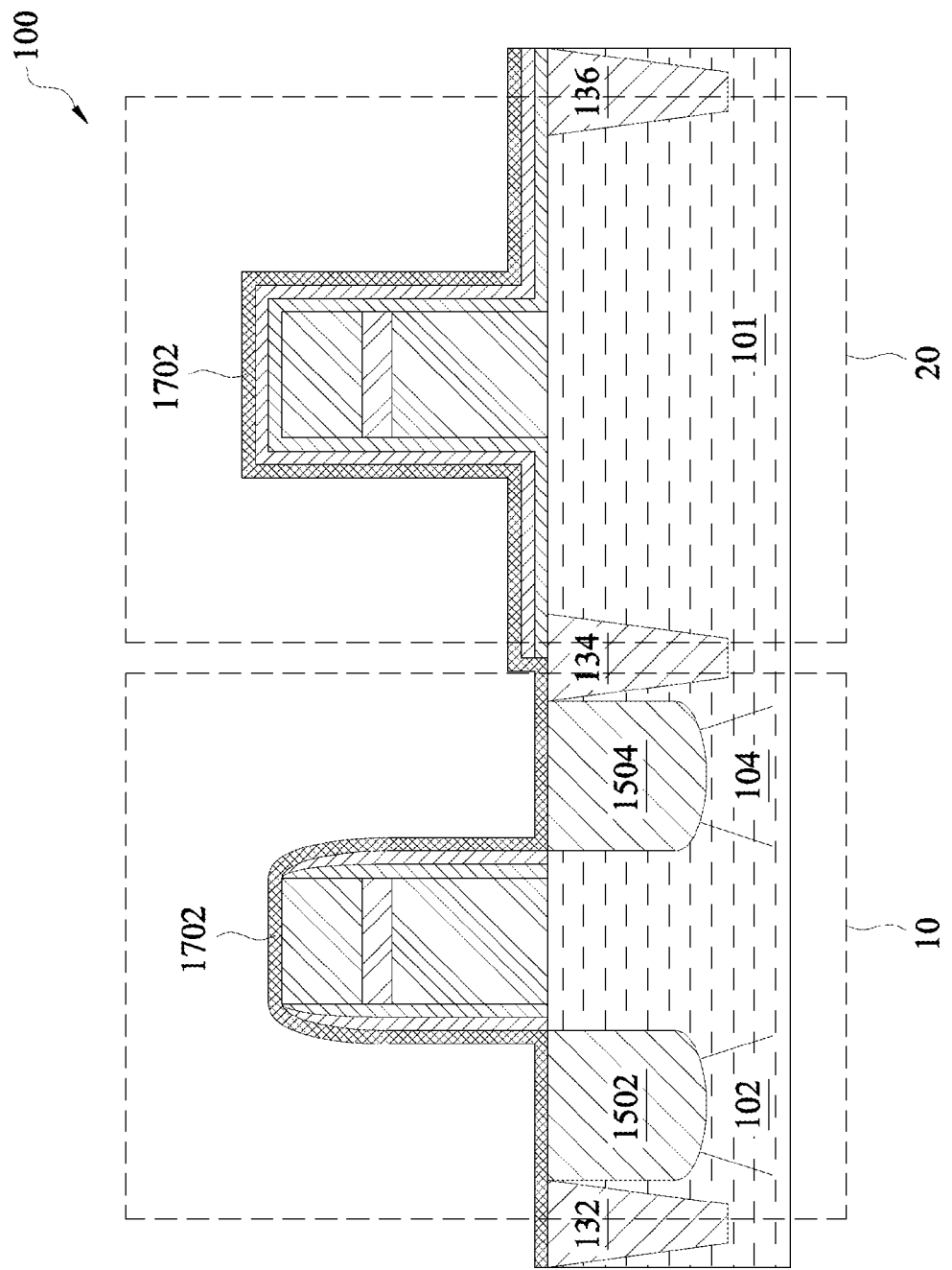

FIG. 17 illustrates a cross sectional view of the semiconductor device shown in FIG. 16 after a silicon nitride layer is formed over the semiconductor device in accordance with various embodiments of the present disclosure. The silicon nitride layer 1702 is formed over the semiconductor device 100 through suitable semiconductor deposition processes. In some embodiments, the thickness of the silicon nitride layer 1702 is about 40 Angstroms.

It should be noted while FIG. 17 illustrates a single silicon nitride layer, one of ordinary skill in the art would recognize many variations, alternatives, and modifications. For example, a multi-layer dielectric layer may also be used.

Figure 18:
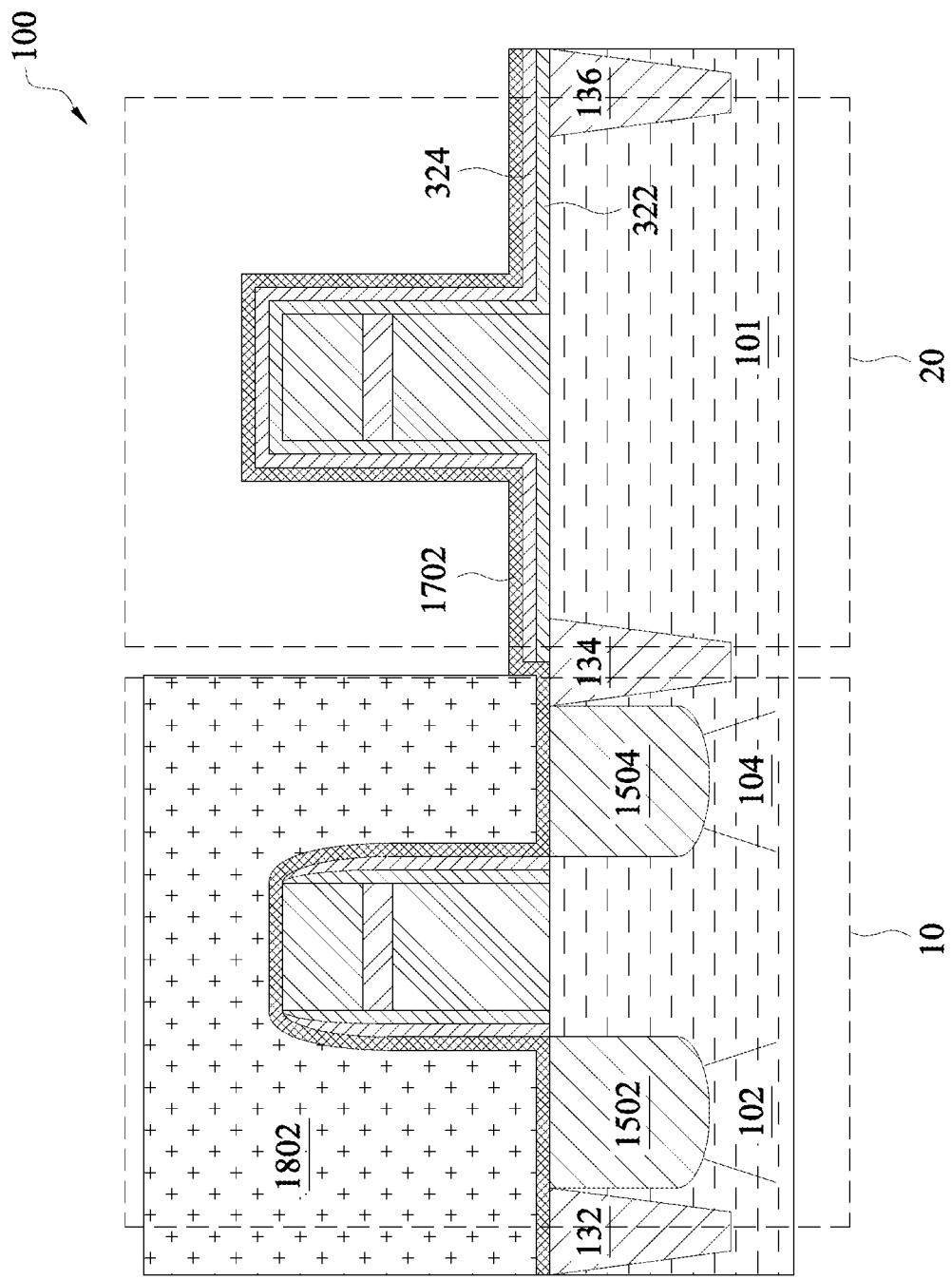

FIG. 18 illustrates a cross sectional view of the semiconductor device shown in FIG. 17 after a photoresist layer is formed over the semiconductor device in accordance with various embodiments of the present disclosure. The photoresist layer 1802 is deposited over the semiconductor device 100. The photoresist layer 1802 is patterned according to the location and shape of the PMOS region 20 of the semiconductor device 100. More particularly, the photoresist layer 1802 may be exposed and developed as part of a suitable photolithography process. After the photolithography process finishes, the portion of the photoresist layer 1802 in the PMOS region 20 has been removed as shown in FIG. 18.

Figure 19:
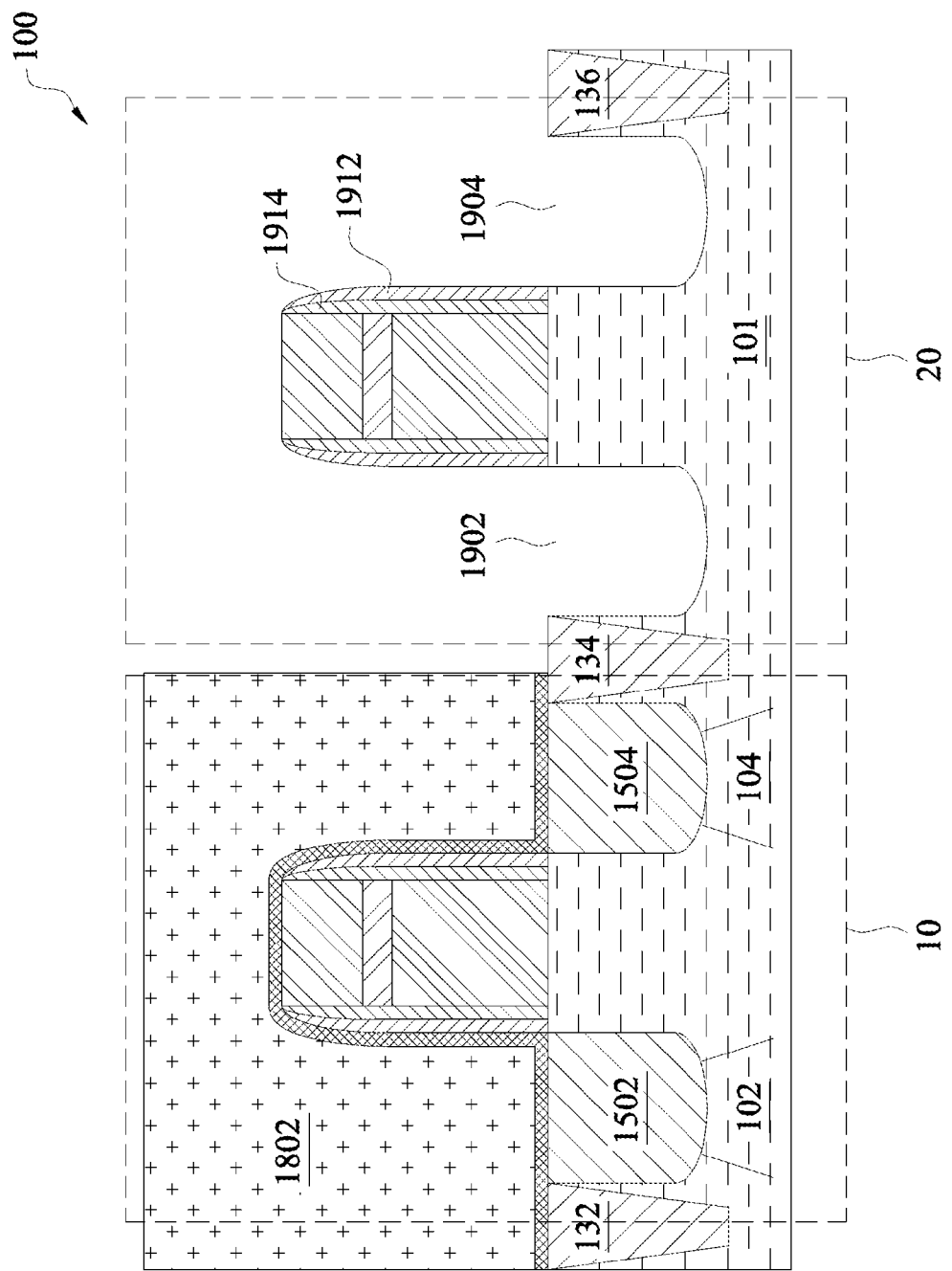

FIG. 19 illustrates a cross sectional view of the semiconductor device shown in FIG. 18 after two drain/source trenches are formed in the second portion of the semiconductor device in accordance with various embodiments of the present disclosure. The exposed portion of the silicon nitride layer 1702 may be removed by suitable etching process.

The horizontal portion of the gate spacer layer (e.g., protection dielectric layers 322 and 324) shown in FIG. 18 may be removed to form gate spacers including a first dielectric portion 1912 and a second dielectric portion 1914. The patterning may be performed by suitable etching processes such as wet etching, dry etching and/or the like.

A third drain/source trench 1902 and a fourth drain/source trench 1904 may be formed by any suitable semiconductor patterning techniques such as an etching process and/or the like. In some embodiments, the exposed portion of the substrate 101 may be removed to form the third drain/source trench 1902 and the fourth drain/source trench 1904 as shown in FIG. 19.

Figure 20:
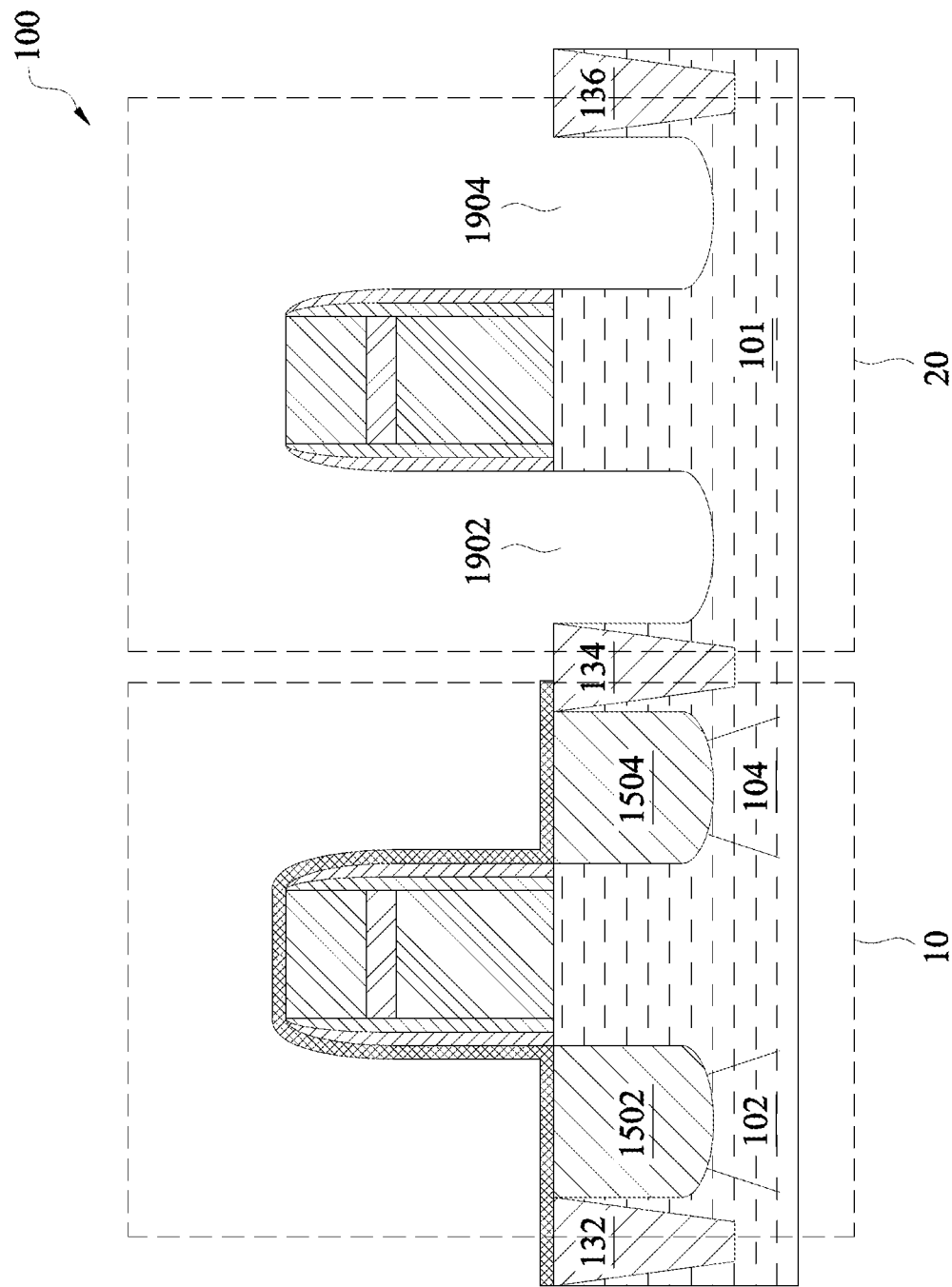

FIG. 20 illustrates a cross sectional view of the semiconductor device shown in FIG. 19 after the remaining photoresist layer has been removed in accordance with various embodiments of the present disclosure. The remaining photoresist layer shown in FIG. 19 may be removed by using suitable photoresist stripping techniques such as chemical solvent cleaning, plasma ashing, dry stripping and/or the like. The photoresist stripping techniques are well known and hence are not discussed in further detail herein to avoid repetition.

Figure 21:
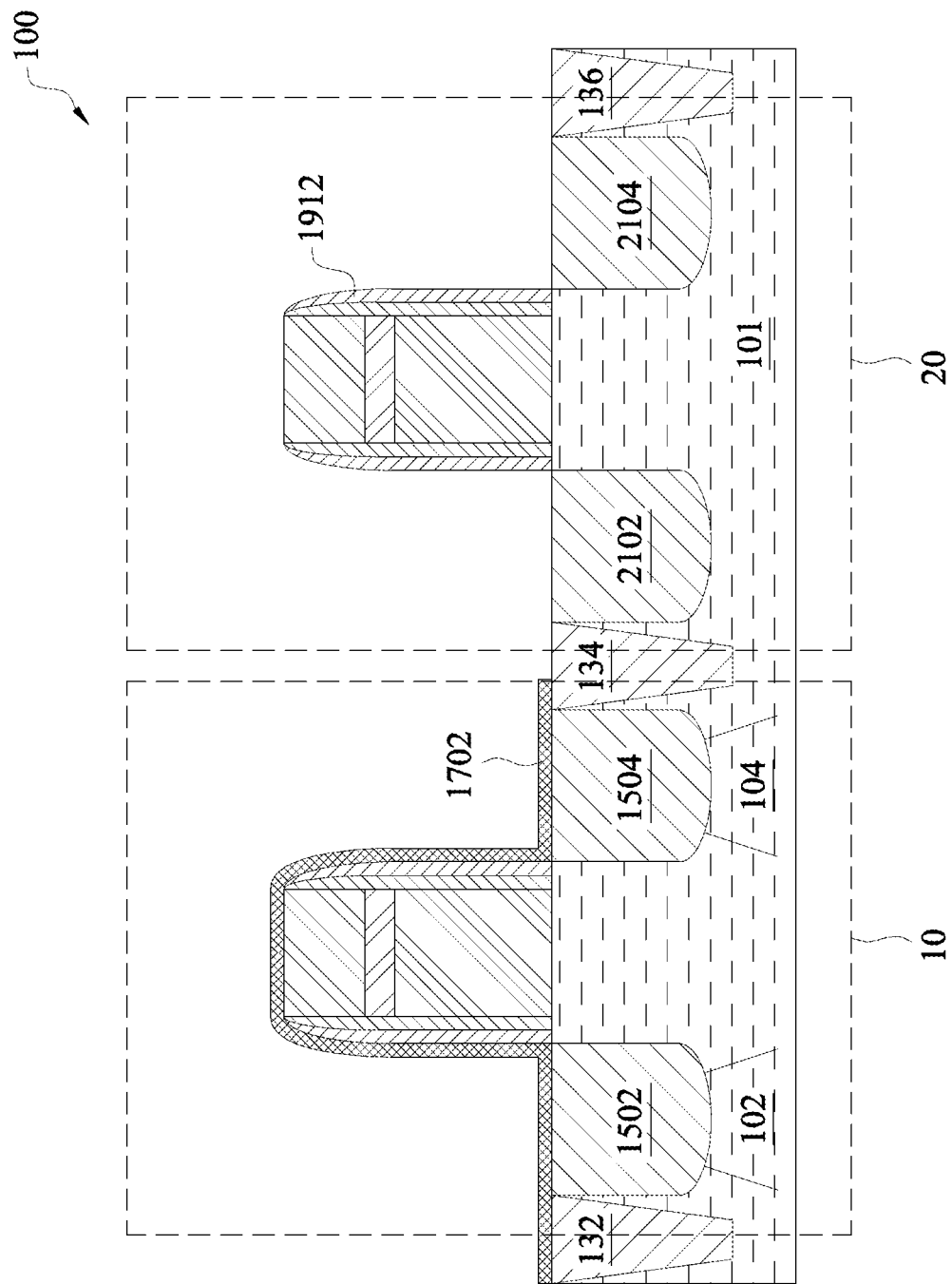

FIG. 21 illustrates a cross sectional view of the semiconductor device shown in FIG. 20 after an epitaxial growth process is applied to the semiconductor device in accordance with various embodiments of the present disclosure. Prior to the epitaxial growth process, a pre-cleaning process may be employed to remove any native oxides or any other contaminants from the surfaces of the third drain/source trench 1902 and the fourth drain/source trench 1904. The pre-cleaning process may be a dry chemical cleaning process such as SiCoNi pre-cleaning processes and/or the like.

In some embodiments, the drain/source regions 2102 and 2104 may comprise a suitable semiconductor material to induce a performance enhancement effect such as strained drain/source features. In some embodiments, the drain/source regions 2102 and 2104 may comprise silicon germanium epitaxial material. In some embodiments, the drain/source regions 2102 and 2104 may be epitaxially grown in the third drain/source trench 1902 and the fourth drain/source trench 1904.

As shown in FIG. 21, after the epitaxial process finishes, the drain/source regions 2102 and 2104 are adjacent to the spacer 1912. More particularly, the drain/source regions 2102 and 2104 are aligned with the edges of the spacer 1912. It should be noted that during the epitaxial growth process, the silicon nitride layer 1702 may function as a capping layer, which protects the NMOS region 10 of the semiconductor device 100.

Figure 22:
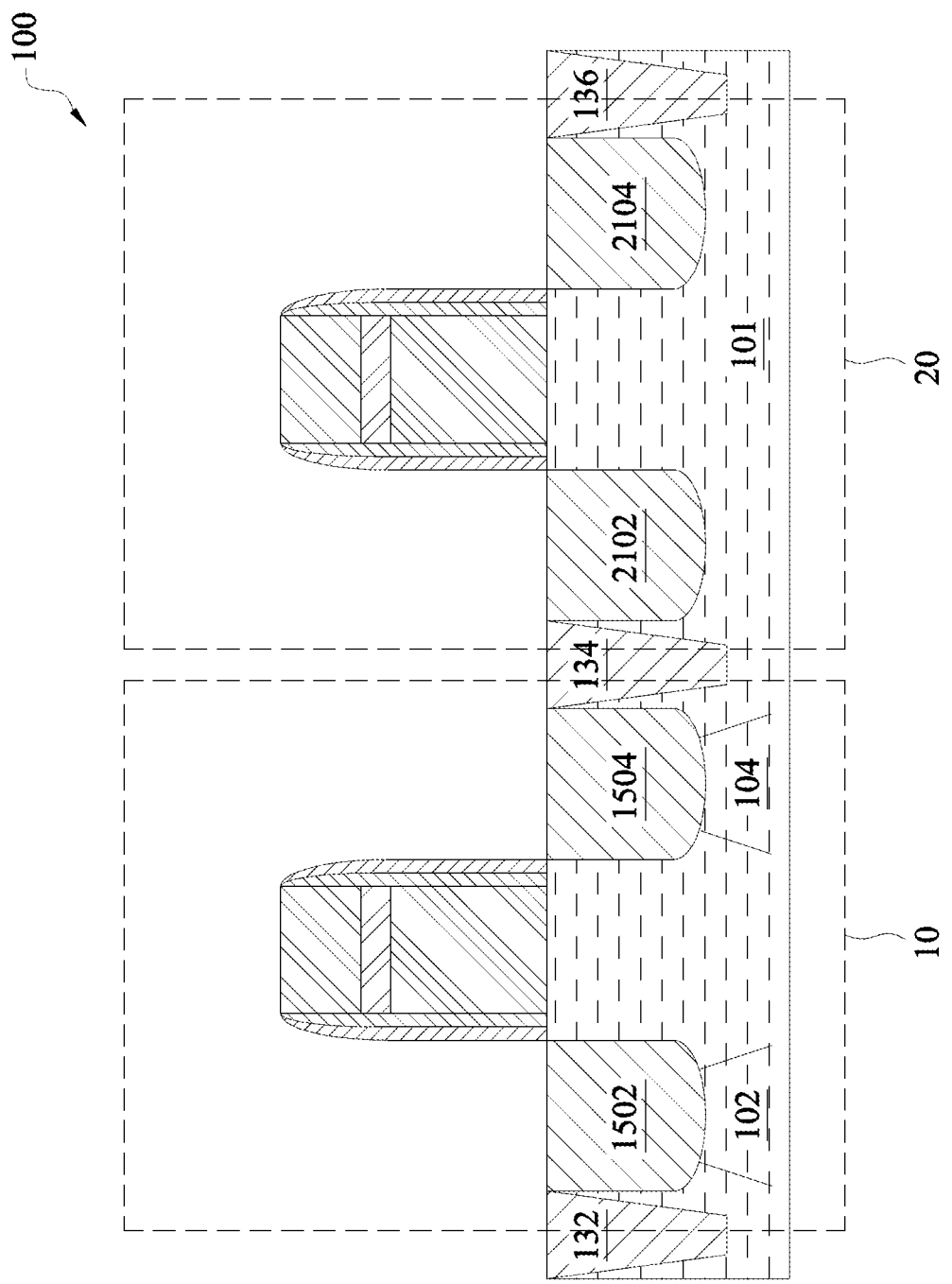

FIG. 22 illustrates a cross sectional view of a semiconductor device shown in FIG. 21 after a silicon nitride removal process has been applied to the semiconductor device in accordance with various embodiments of the present disclosure. The silicon nitride layer 1702 shown in FIG. 21 may be removed by suitable etching processes such as a dry etching process, a wet etching process and any combinations thereof.

Figure 23:
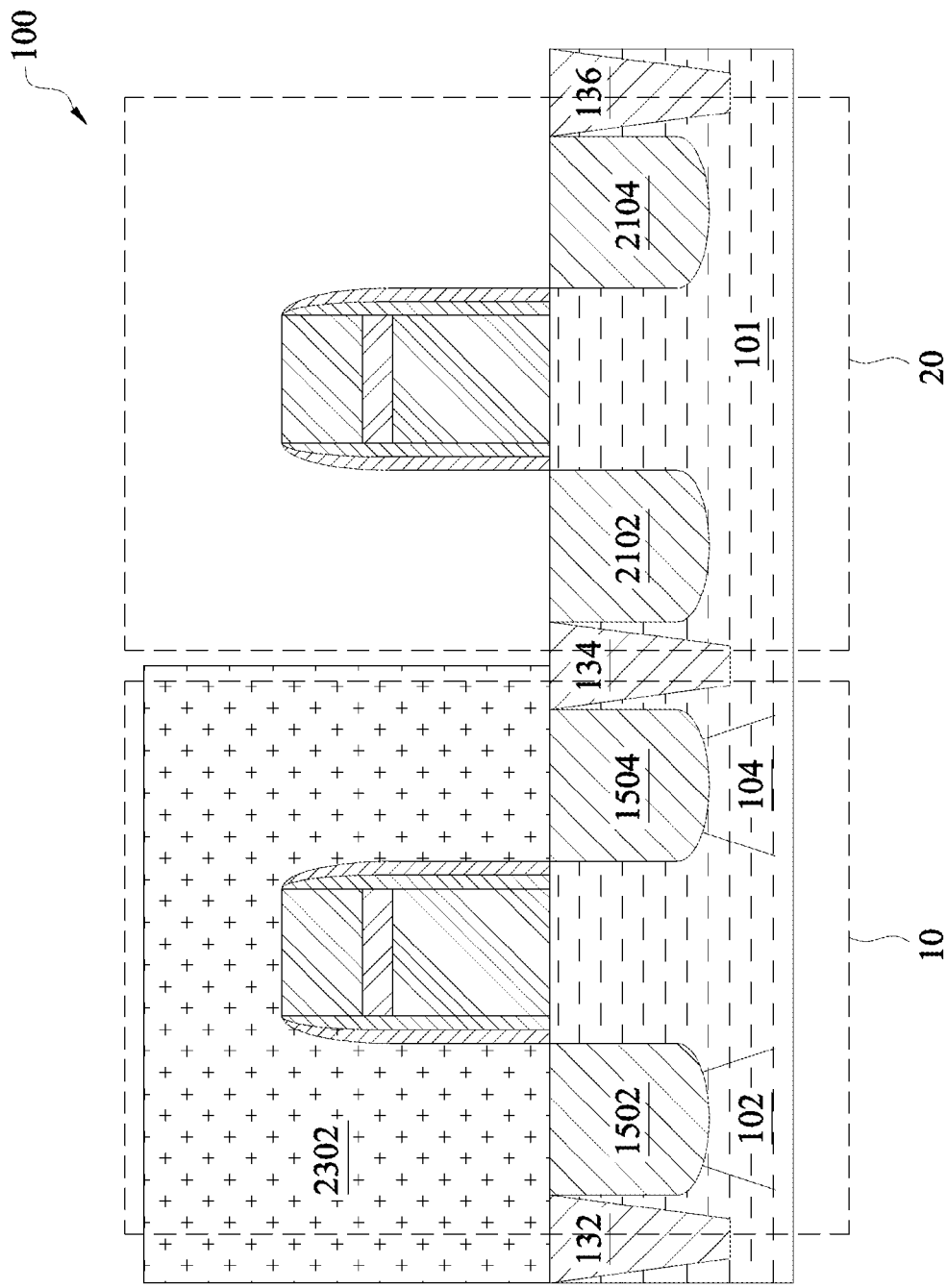

FIG. 23 illustrates a cross sectional view of the semiconductor device shown in FIG. 22 after a photoresist layer is formed over the semiconductor device in accordance with various embodiments of the present disclosure. The photoresist layer 2302 is deposited over the semiconductor device 100. The photoresist layer 2302 is patterned according to the location and shape of the PMOS region 20 of the semiconductor device 100. More particularly, the photoresist layer 2302 may be exposed and developed as part of a suitable photolithography process. After the photolithography process finishes, the portion of the photoresist layer 2302 in the PMOS region 20 has been removed as shown in FIG. 23.

Figure 24:
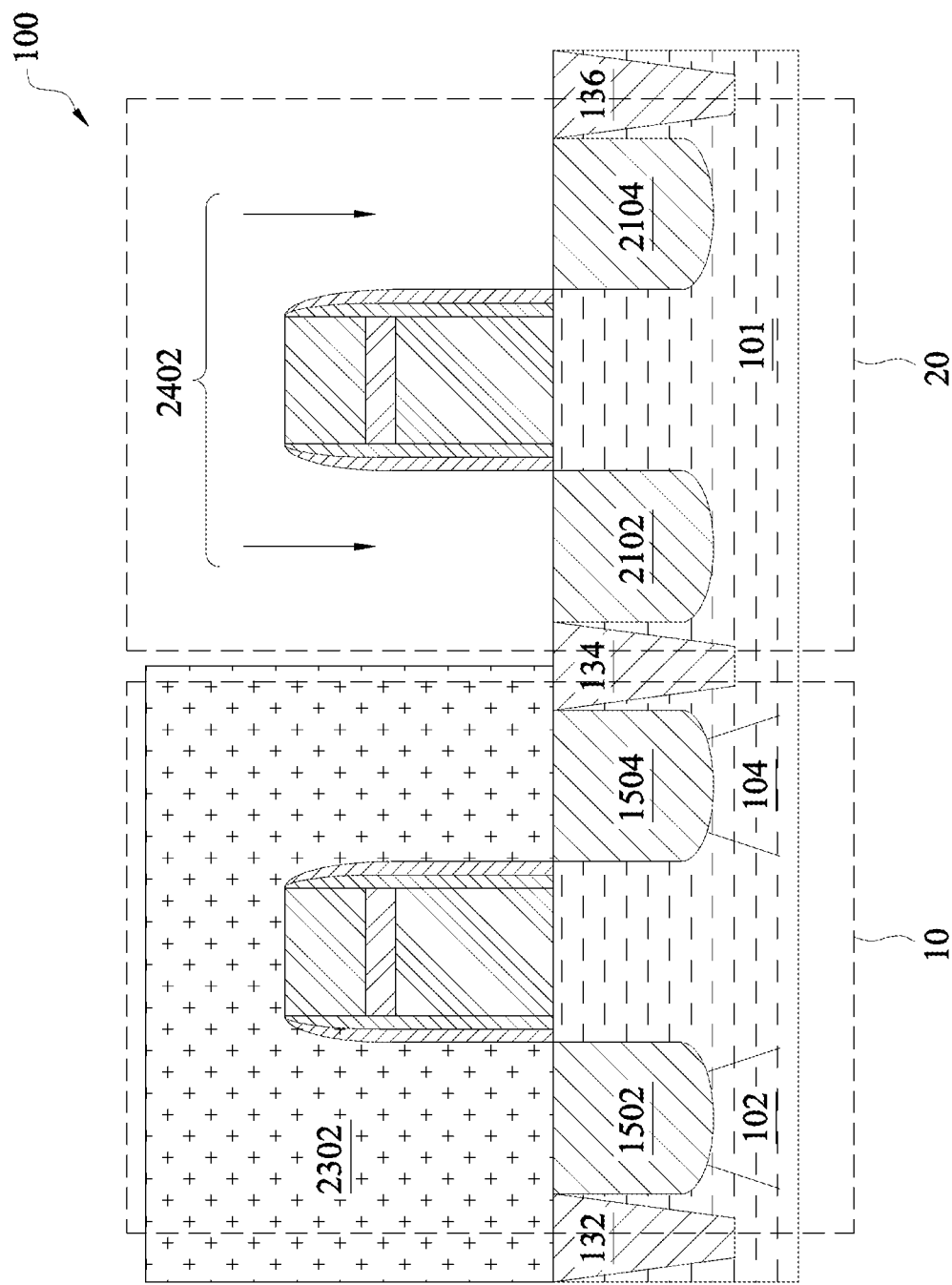

FIG. 24 illustrates a cross sectional view of the semiconductor device shown in FIG. 23 after an ion implantation process is applied to the semiconductor device in accordance with various embodiments of the present disclosure. As indicated by arrows 2402, suitable p-type semiconductor materials such as such as boron, gallium, indium and/or the like are implanted to form the p-type drain/source regions 2102 and 2104.

Figure 25:
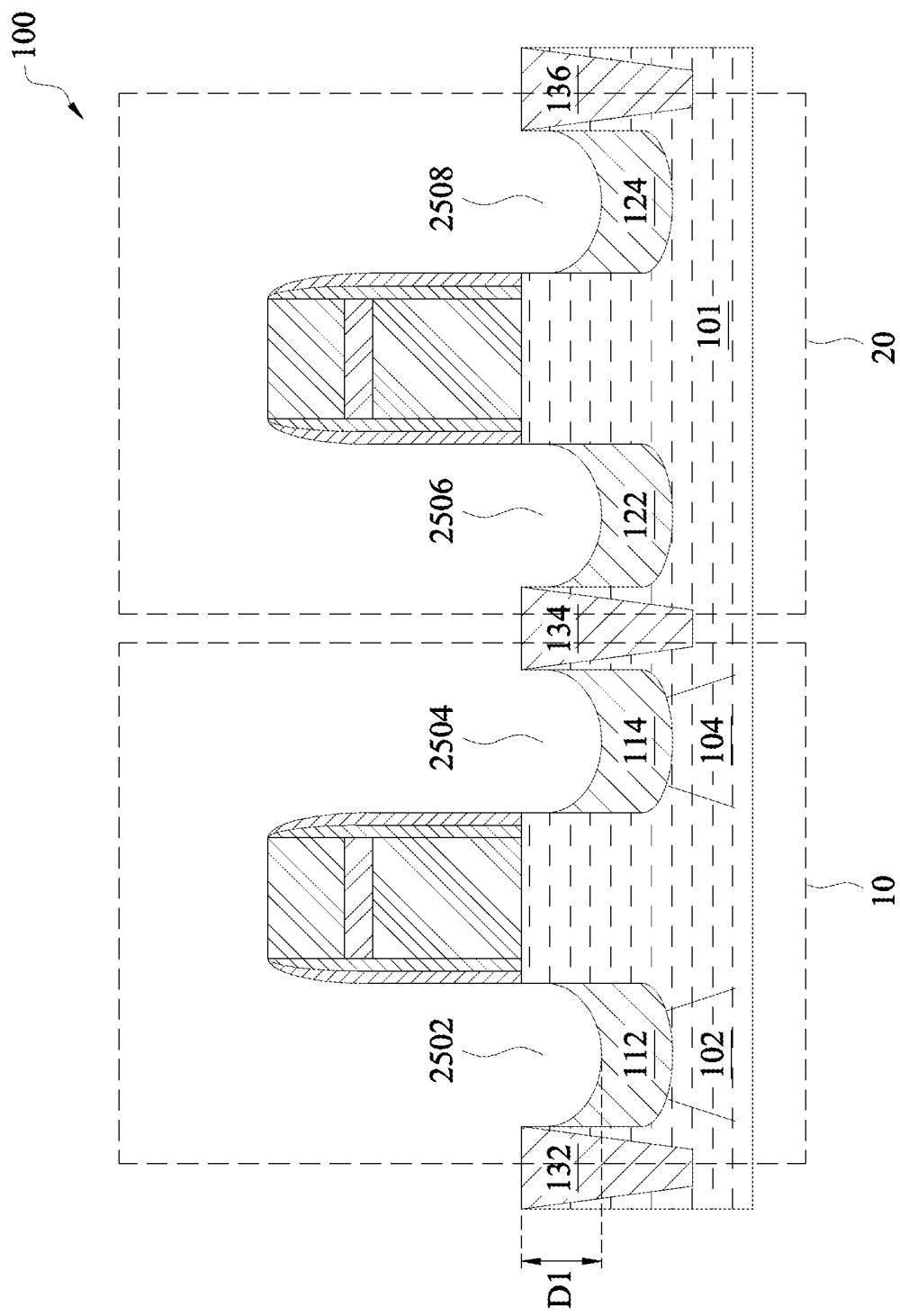

FIG. 25 illustrates a cross sectional view of the semiconductor device shown in FIG. 24 after an etching process is applied to the semiconductor device in accordance with various embodiments of the present disclosure. The remaining photoresist layer 2302 may be removed by suitable photoresist stripping techniques. A suitable etching process such as a dry etching process may be applied to the drain/source regions 1502, 1504, 2102 and 2104. As a result of the dry etching process, upper portions of the drain/source regions 1502, 1504, 2102 and 2104 have been removed to form recesses 2502, 2504, 2506 and 2508. The remaining drain/source regions form the drain/source regions 112, 114, 122 and 124 shown in FIG. 1. As shown in FIG. 25, the drain/source regions 112, 114, 122 and 124 have concave surfaces. The depth of the recesses 2502, 2504, 2506 and 2508 is defined as D1. In some embodiments, D1 is in a range from about 5 nm to about 25 nm.

Figure 26:
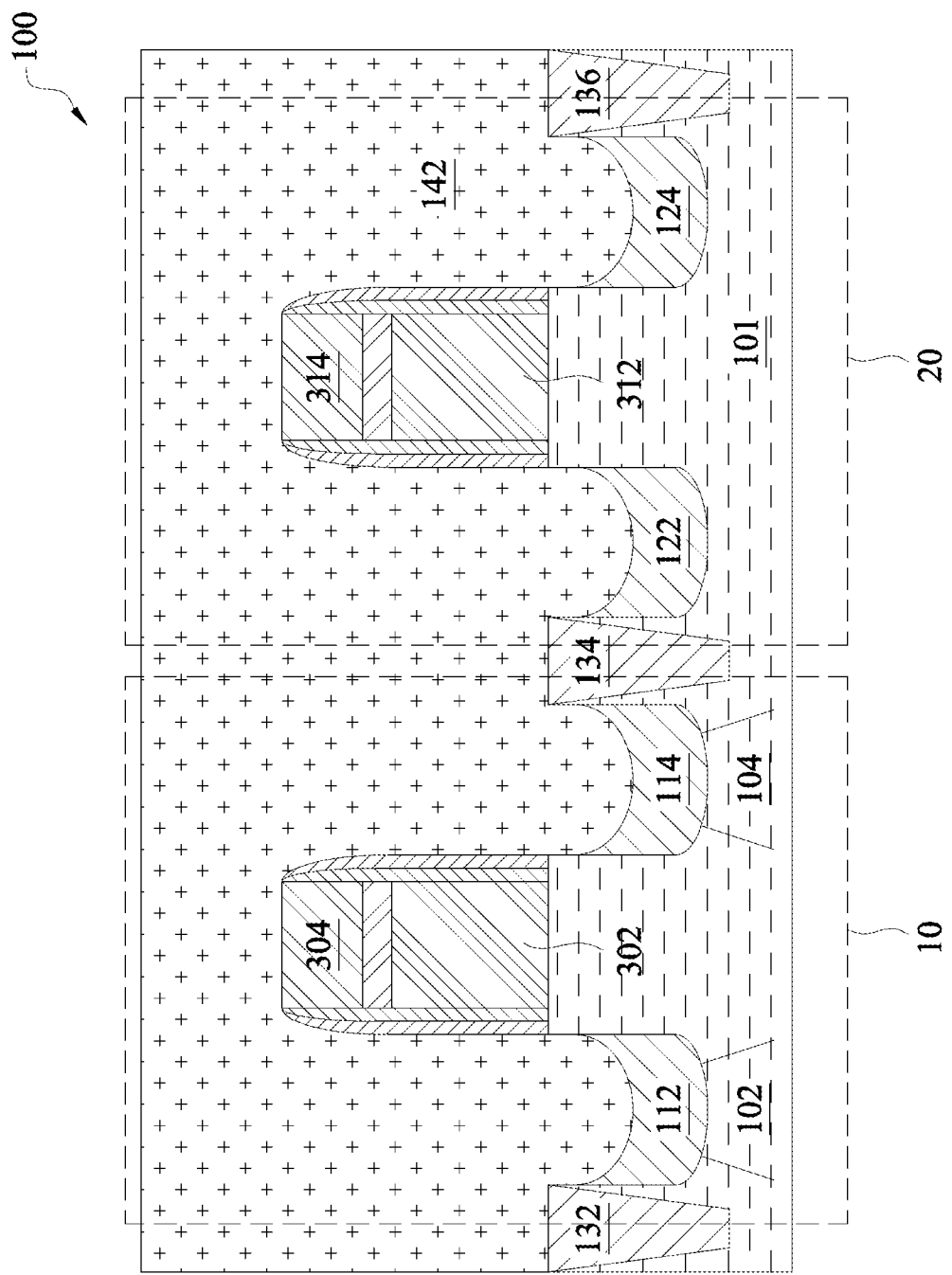

FIG. 26 illustrates a cross sectional view of the semiconductor device shown in FIG. 25 after a first dielectric layer is deposited over the semiconductor device in accordance with various embodiments of the present disclosure. The first dielectric layer 142 may be formed by CVD, sputtering, or any other methods known and used in the art for forming a dielectric layer.

The first dielectric layer 142 may be about 4,000 Angstroms to about 13,000 Angstroms in thickness, but other thicknesses may be used. The first dielectric layer 142 may comprise suitable dielectric materials such as doped or undoped silicon oxide, although other materials such as silicon nitride doped silicate glass, high-k materials, combinations of these, or the like, may alternatively be utilized.

Figure 27:
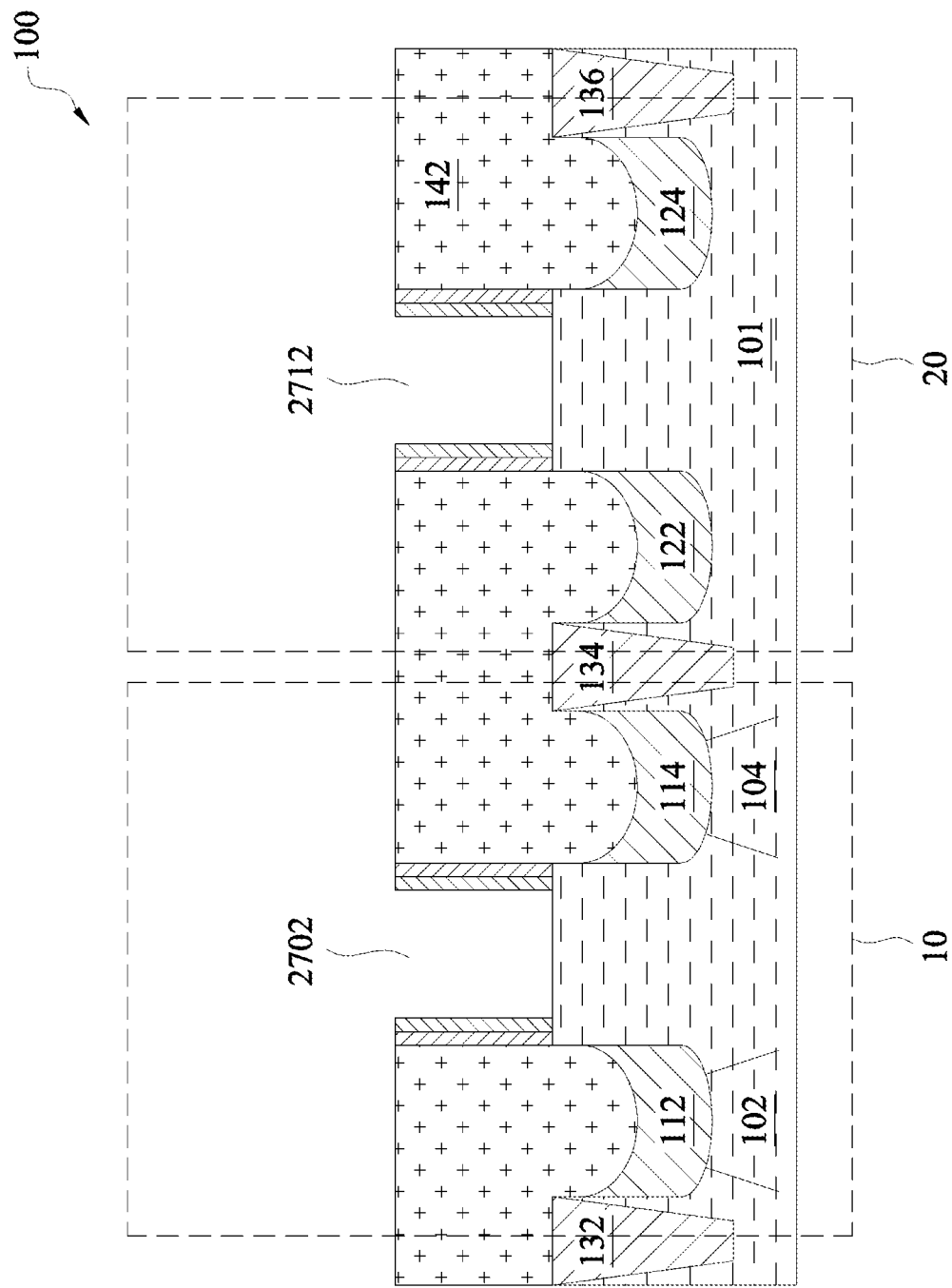

FIG. 27 illustrates a cross sectional view of the semiconductor device shown in FIG. 26 after dummy gate electrodes have been removed in accordance with various embodiments of the present disclosure. The excess dielectric materials of the first dielectric layer 142 may be removed by using suitable removal techniques such as grinding, polishing and/or chemical etching, a combination of etching and grinding techniques and the like.

In accordance with some embodiments, the removal process may be implemented by using a CMP process. In the CMP process, a combination of etching materials and abrading materials are put into contact with the top surface of the first dielectric layer 142 and a grinding pad (not shown) is used to grind away the excess materials until the top surfaces of the dummy gate electrodes 302 and 312 are exposed.

The dummy gate electrode 302 and 312 shown in FIG. 26 are removed by suitable etching processes such as a dry etching process, a wet etching process and any combinations thereof. As a result, two gate openings 2702 and 2704 may be formed.

Figure 28:
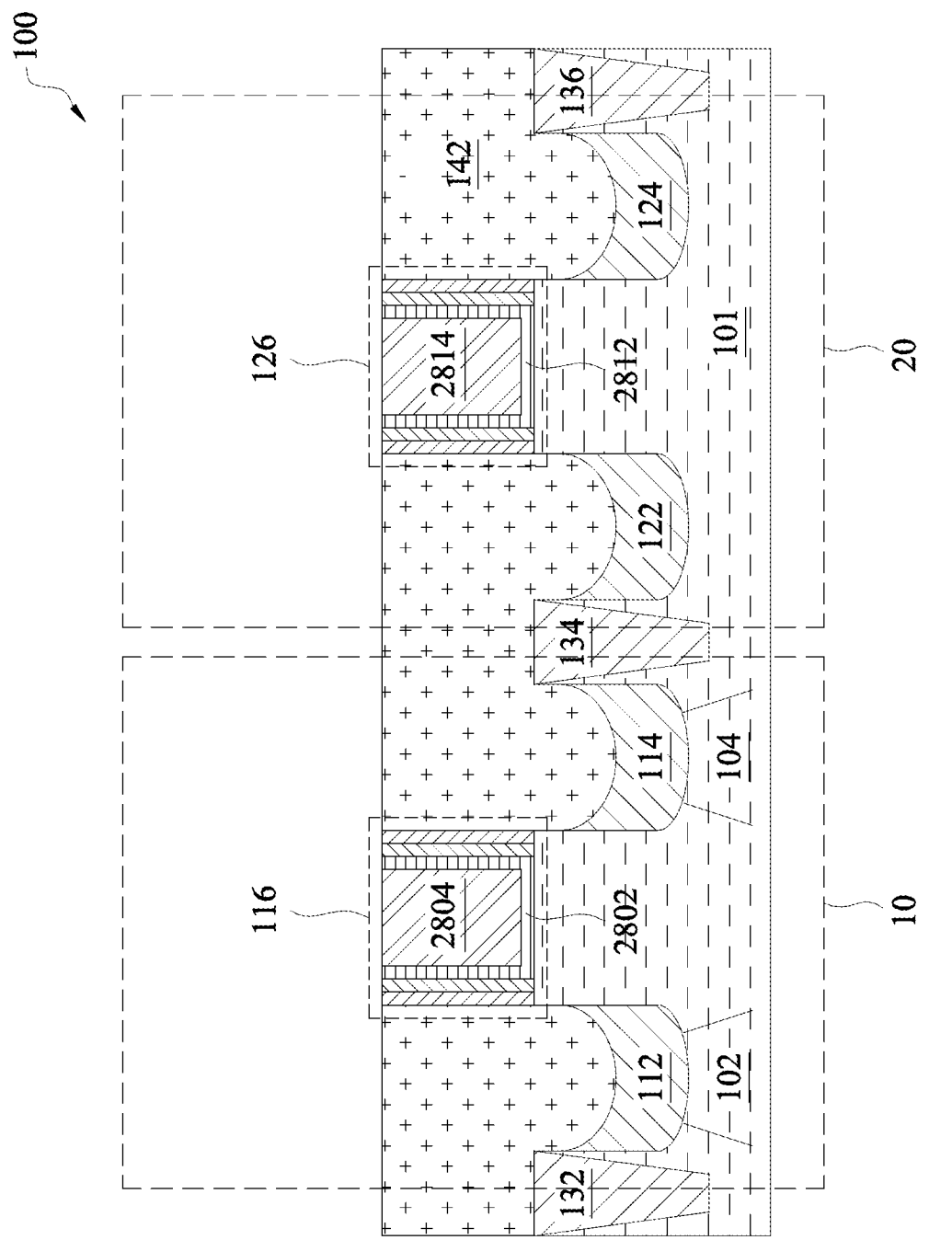

FIG. 28 illustrates a cross sectional view of the semiconductor device shown in FIG. 27 after gate electrodes are formed over the semiconductor device in accordance with various embodiments of the present disclosure. Gate dielectric layers 2802 and 2812 are deposited conformally in the gate openings 2702 and 2712 respectively. The gate dielectric layers 2802 and 2812 may be a dielectric material such as silicon oxide, silicon oxynitride, silicon nitride, an oxide, a nitrogen-containing oxide, a combination thereof and/or the like.

The gate dielectric layers 2802 and 2812 may have a relative permittivity value greater than about 4. Other examples of such materials include aluminum oxide, lanthanum oxide, hafnium oxide, zirconium oxide, hafnium oxynitride, combinations thereof and/or the like. In an embodiment in which the gate dielectric layers 2802 and 2812 may comprise an oxide layer, the gate dielectric layers 2802 and 2812 may be formed by a thermal process using steam as a precursor or by a wet process using O3 as a precursor.

The gate electrode layers 2804 and 2814 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped polycrystalline silicon, other conductive materials, combinations thereof and/or the like. After the gate electrode layers 2804 and 2814 are filled the gate openings 2702 and 2712 respectively, a CMP process may be performed to remove the excess portions of the material of the gate electrode layers 2804 and 2814.

Figure 29:
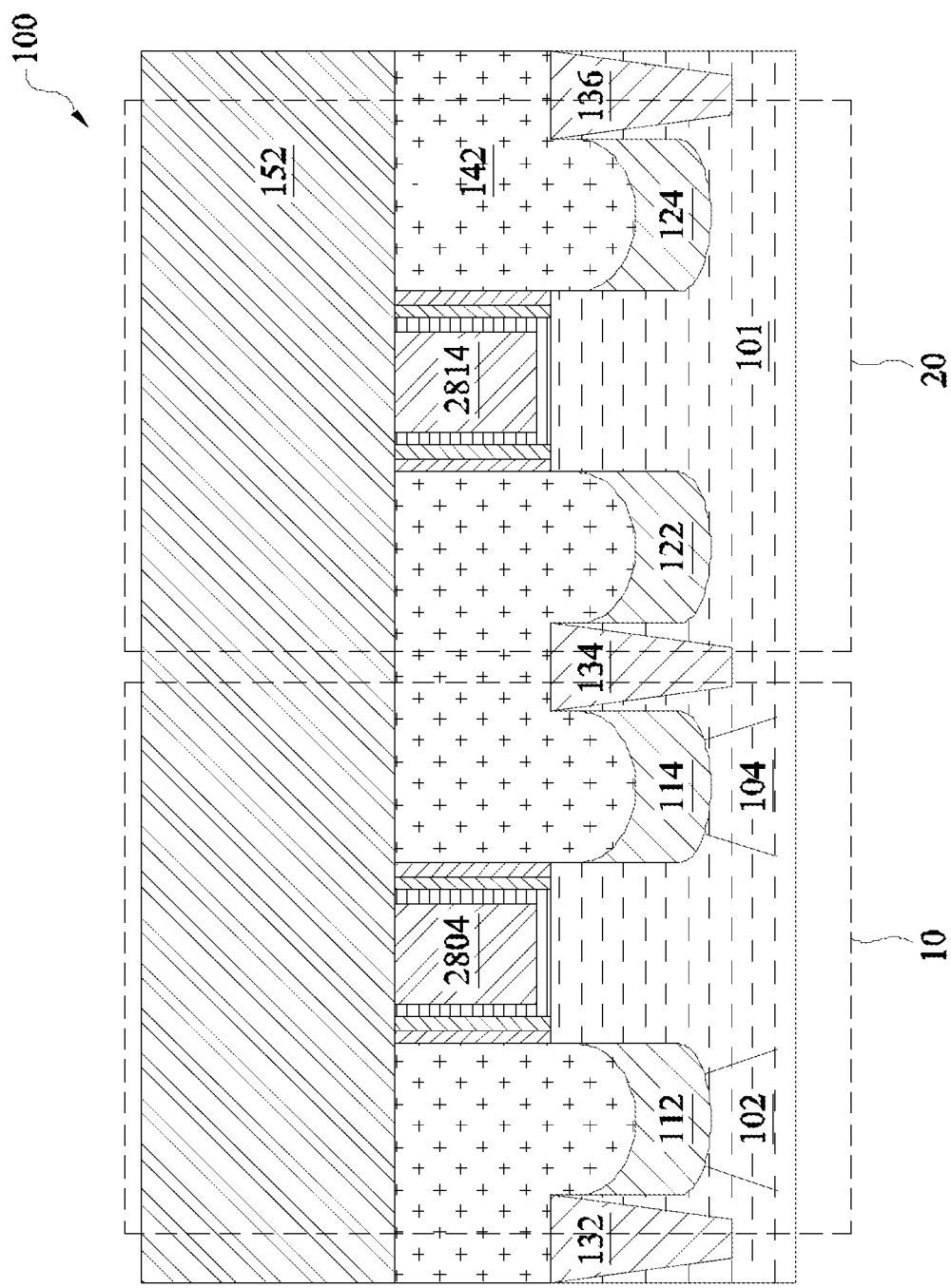

FIG. 29 illustrates a cross sectional view of the semiconductor device shown in FIG. 28 after a second dielectric layer is deposited over the semiconductor device in accordance with various embodiments of the present disclosure. The second dielectric layer 152 may be formed by CVD, sputtering, or any other methods known and used in the art for forming a dielectric layer.

The second dielectric layer 152 may be about 4,000 Angstroms to about 13,000 Angstroms in thickness, but other thicknesses may be used. The second dielectric layer 152 may comprise doped or undoped silicon oxide, although other materials such as silicon nitride doped silicate glass, high-k materials, combinations of these, or the like, may alternatively be utilized.

Figure 30:
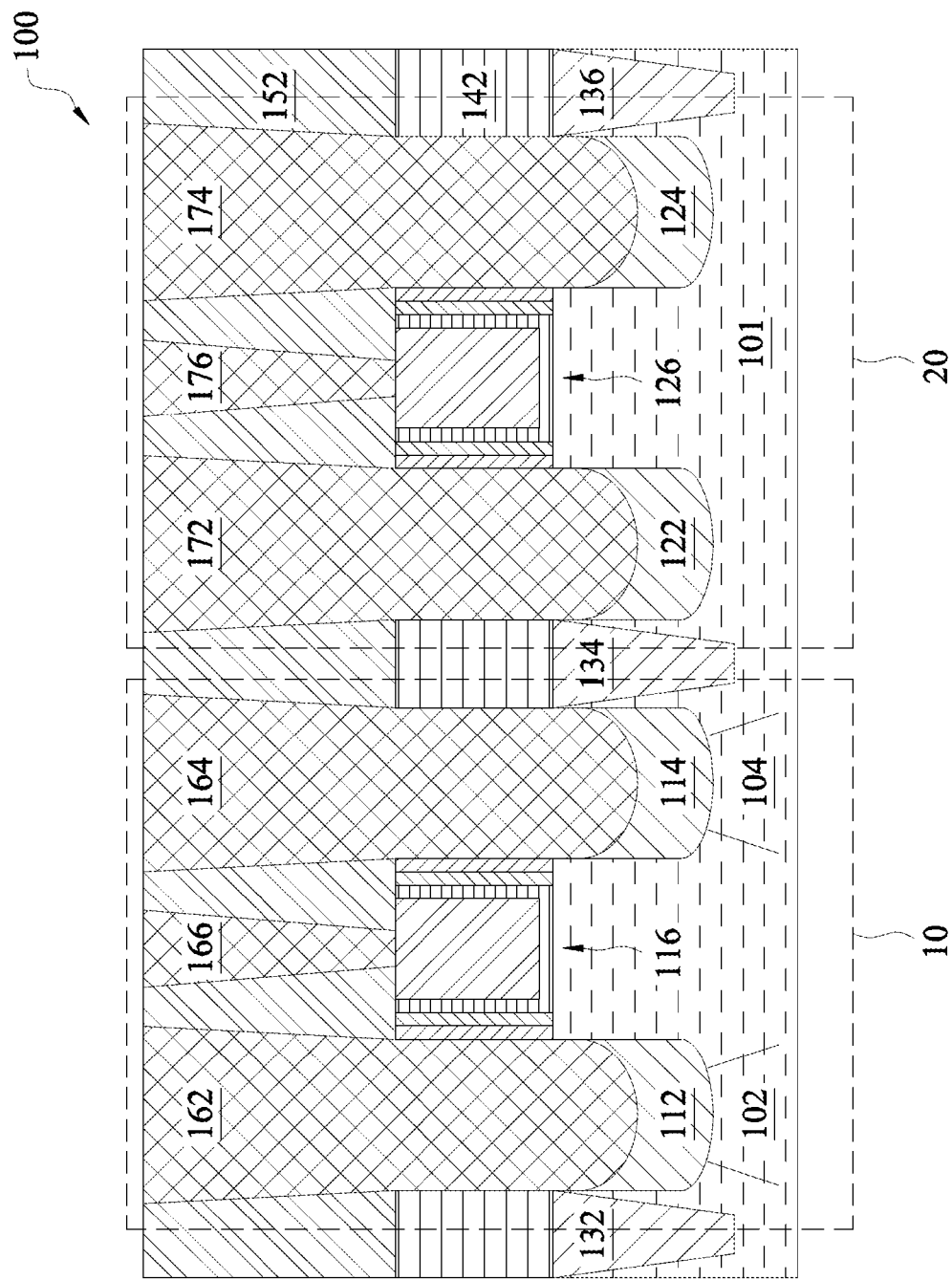

FIG. 30 illustrates a cross sectional view of the semiconductor device shown in FIG. 29 after drain/source contact plugs are formed in accordance with various embodiments of the present disclosure. Prior to the formation of the contact plugs such as drain/source contacts 162, 164, 172 and 174, silicide regions (not shown) may be formed over their respective drain/source regions.

The silicide regions may be formed by a salicide process. In a salicide process, a thin layer of metal is blanket deposited over a semiconductor wafer having exposed drain/source and gate electrode regions. The wafer is then subjected to one or more annealing steps. This annealing process causes the metal to selectively react with the exposed silicon of the source/drain regions and the gate electrodes, thereby forming metal silicide regions over the drain/source regions as well as the gate electrodes. The process is referred to as a self-aligned silicidation process because the silicide layer is formed only where the metal material directly contacts the silicon drain/source regions and the gate electrodes.

In some embodiments, silicide regions may comprise metals that react with silicon such as titanium, platinum, cobalt and the like. However, other metals, such as manganese, palladium and the like, can also be used.

An anisotropic etching process is applied to the first dielectric layer 142 and the second dielectric layer 152. A plurality of openings (not shown) may be formed as a result of the anisotropic etching process. After the openings have been formed, the silicide regions over the gate electrodes and drain/source regions are exposed.

A metallic material, which includes tungsten, titanium, aluminum, copper, any combinations thereof and/or the like, is filled into the openings, forming contact plugs 162, 164, 166, 172, 174 and 176 as shown in FIG. 28.

Figure 31:
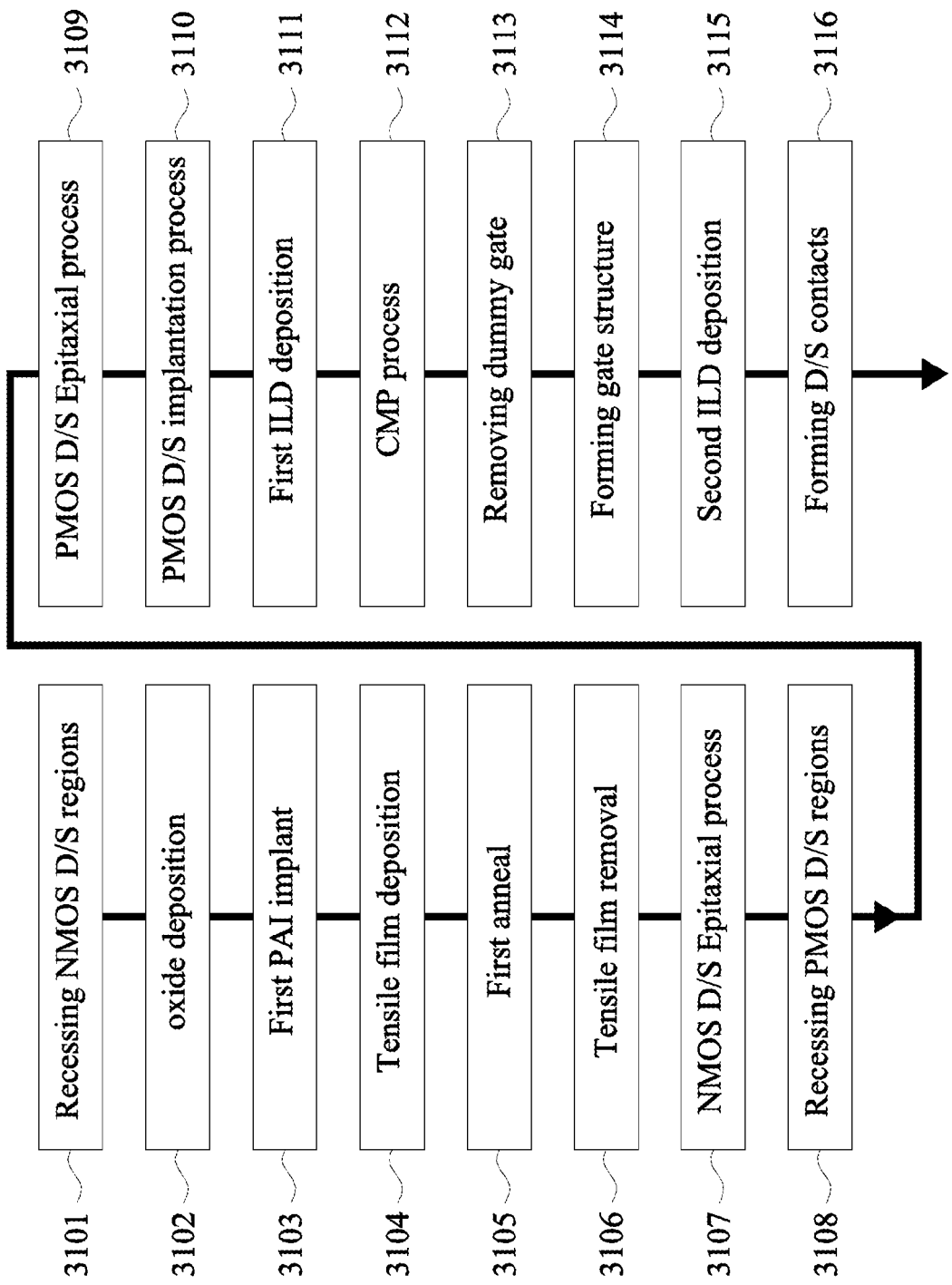
FIG. 31 is a process flow of the fabrication steps shown in FIGS. 3-30 in accordance with various embodiments of the present disclosure.

One advantageous feature of having the recesses 2502, 2504, 2506 and 2508 shown in FIG. 25 is that the concave surfaces of the recesses help to increase the landing areas of the drain/source contacts 162, 164, 172 and 174 so as to reduce the contact resistance of each drain/source contact. As such, the performance of the semiconductor device 100 may be improved accordingly FIG. 31 is a process flow of the fabrication steps shown in FIGS. 3-30 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 31 may added, removed, replaced, rearranged and repeated.

At step 3101, a semiconductor device includes a first portion (an NMOS region) and a second portion (a PMOS region) separated by an isolation region. An etching process is applied to the first portion of the semiconductor device to form two drain/source trenches.

At step 3102, an oxide layer is deposited in the drain/source trenches. The oxide layer is formed on the bottoms as well as the sidewalls of the drain/source trenches. At step 3103, a PAI process is applied to the substrate. As a result of the first PAI process, two PAI regions may be formed in the substrate.

At step 3104, a tensile film layer is deposited in the drain/source trenches. The tensile film layer is formed on the sidewalls and the bottom of each drain/source trench. At step 3105, a first annealing process is employed to convert the PAI regions into their respective dislocation planes.

At step 3106, a suitable etching process is employed to remove the tensile film and the oxide layer. At step 3107, the drain/source regions of an n-type transistor are formed in the drain/source trenches through suitable drain/source formation processes such as an epitaxial process.

At step 3108, an etching process is applied to the second portion of the semiconductor device to form two drain/source trenches. At step 3109, the drain/source regions of a p-type transistor are formed in the drain/source trenches of the second portion through suitable processes such as an epitaxial process.

At step 3110, an ion implantation process is applied to the drain/source regions to form p-type drain/source regions. At step 3111, a first dielectric layer is formed over the substrate. At step 3112, a CMP process is applied to the first dielectric layer until the top surfaces of the dummy gates are exposed.

At step 3113, the dummy gates are removed through suitable etching processes. At step 3114, gate structures are formed as shown in FIG. 28. At step 3115, a second dielectric layer is deposited over the first dielectric layer. At step 3116, contact plugs such as drain/source contact plugs are formed.

Figure 32:
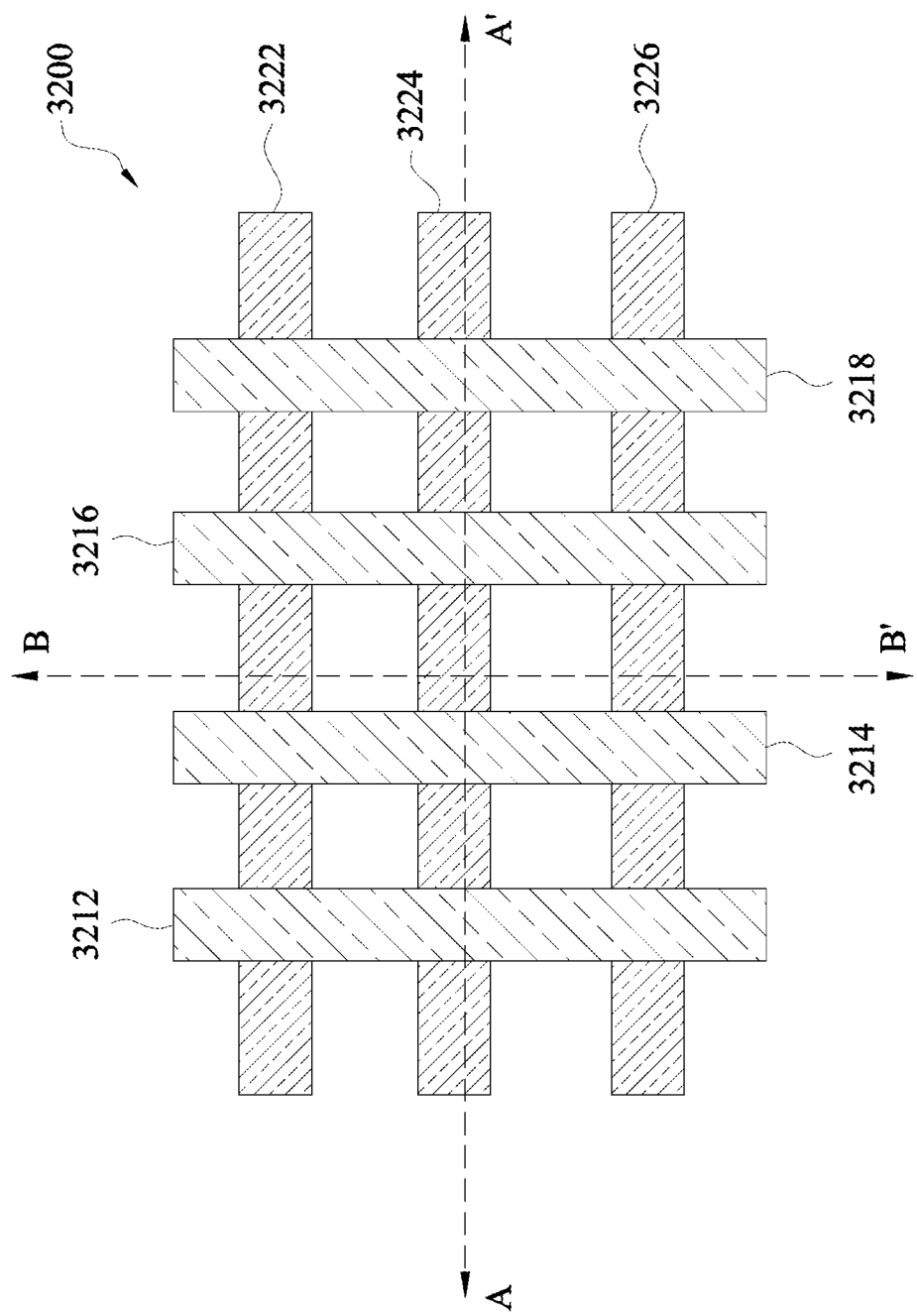
FIG. 32 illustrates a top view a semiconductor device in accordance with various embodiments of the present disclosure.

FIG. 32 illustrates a top view a semiconductor device in accordance with various embodiments of the present disclosure. The semiconductor device 3300 may comprise three fin lines 3222, 3224 and 3226. The semiconductor device 3300 may further comprise four gate regions 3212, 3214, 3216 and 3218. A transistor may be formed at the cross point between a fin line and a gate region. For example, there is a transistor formed at the cross point between the fin line 3222 and the gate region 3212.

Figure 33:
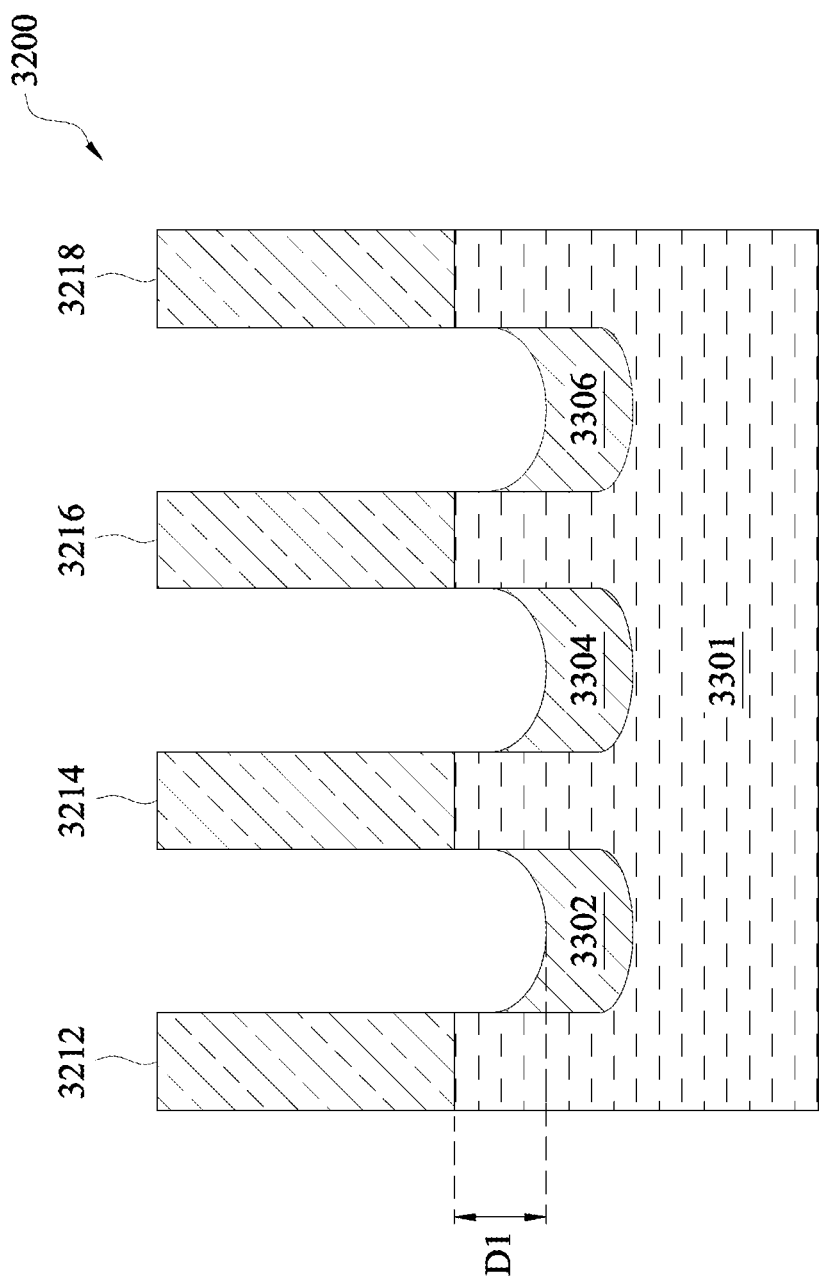
FIG. 33 illustrates a cross sectional view the semiconductor device 3200 in accordance with various embodiments of the present disclosure.

FIG. 33 illustrates a cross sectional view the semiconductor device 3200 in accordance with various embodiments of the present disclosure. The cross sectional view of the semiconductor device in FIG. 33 is taken along the dashed line A-A' shown in FIG. 32. As shown in FIG. 33, there may be three drain/source regions 3302, 3304 and 3306 formed over a substrate 3301. The cross sectional view shows the drain/source regions 3302, 3304 and 3306 have a concave surface. In other words, there is a recess formed over each drain/source region. The formation process of the recess is similar to that shown in FIGS. 3-30, and hence is not discussed herein.

As shown in FIG. 33, the recess has a depth D1. In accordance with an embodiment, D1 is in a range from about 5 nm to about 25 nm. In other words, the depth of the recess with reference to the top surface of the fins (e.g., fin 3224) is in a range from about 5 nm to about 25 nm.

Figure 34:
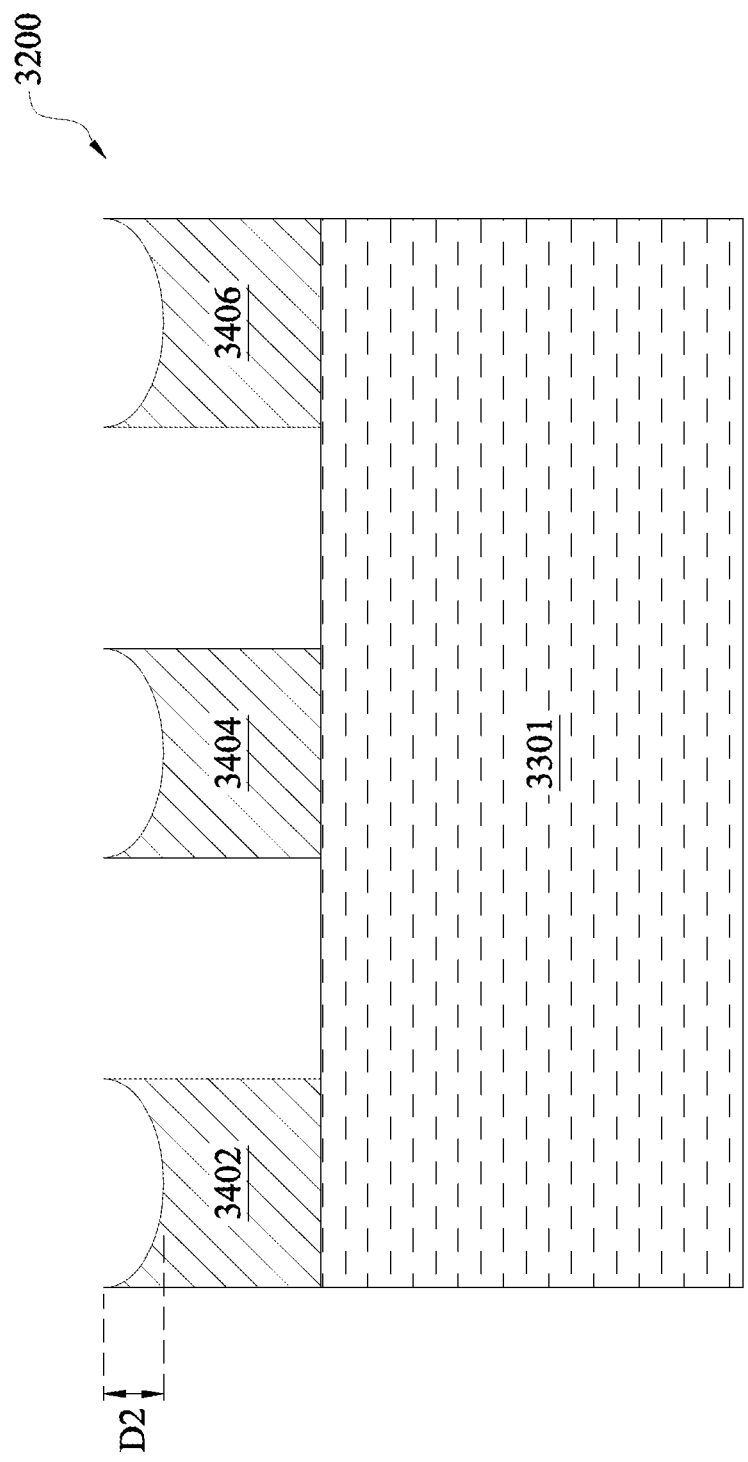
FIG. 34 illustrates another cross sectional view the semiconductor device 3200 in accordance with various embodiments of the present disclosure.

FIG. 34 illustrates another cross sectional view the semiconductor device 3200 in accordance with various embodiments of the present disclosure. The cross sectional view of the semiconductor device in FIG. 34 is taken along the dashed line B-B' shown in FIG. 32. In some embodiments, the semiconductor device 3200 may have a non-crown structure. As shown in FIG. 34, there may be three drain/source regions 3402, 3404 and 3406 formed over a substrate 3301. The drain/source regions 3402, 3404 and 3406 are three separate regions. The cross sectional view shows the drain/source regions 3402, 3404 and 3406 have a concave surface. There is a recess formed over each drain/source region. As shown in FIG. 34, the recess has a depth D2. In accordance with an embodiment, D2 is in a range from about 5 nm to about 25 nm.

Figure 35:
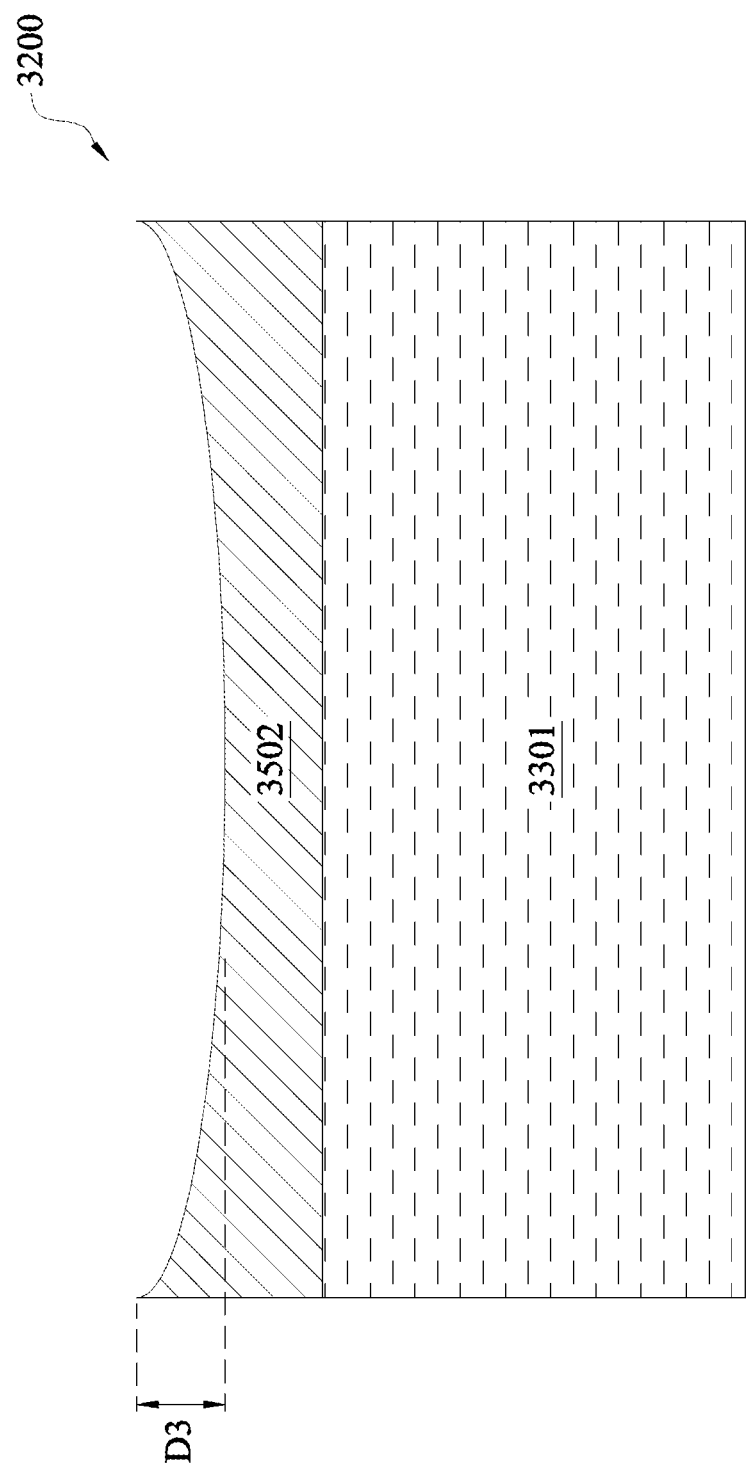
FIG. 35 illustrates yet another cross sectional view the semiconductor device 3200 in accordance with various embodiments of the present disclosure.

FIG. 35 illustrates yet another cross sectional view the semiconductor device 3200 in accordance with various embodiments of the present disclosure. The cross sectional view of the semiconductor device in FIG. 35 is taken along the dashed line B-B' shown in FIG. 32. The semiconductor device shown in FIG. 35 is similar to that shown in FIG. 34 except that the semiconductor device 3200 shown in FIG. 35 may have a crown structure. In other words, the drain/source regions may be connected together to form a single drain/source region during an epitaxial growth process. Both the crown structure and the non-crown structure of FinFETs are well known, and hence are not discussed in further detail herein.

As shown in FIG. 35, there is a recess formed over the drain/source region 3502. As shown in FIG. 35, the recess has a depth D3. In accordance with an embodiment, D3 is in a range from about 5 nm to about 25 nm.

In accordance with an embodiment, a method comprises epitaxially growing a first semiconductor material to form a first drain/source region and a second drain/source region in a semiconductor substrate, applying a first etching process to top surfaces of the first drain/source region and the second drain/source region and forming a first recess in the first drain/source region and a second recess in the second drain/source region as a result of the first etching process and forming a first drain/source contact and a second drain/source contact, wherein a bottom portion of the first drain/source contact is in the first recess and a bottom portion of the second drain/source contact is in the second recess.

In accordance with an embodiment, a device comprises a substrate comprising a first portion and a second portion separated by an isolation region, a first gate structure over the first portion, a first drain/source region and a second drain/source region in the first portion and on opposite sides of the first gate structure, wherein the first drain/source region and the second drain/source have concave surfaces, a second gate structure over the second portion and a third drain/source region and a fourth drain/source region in the second portion and on opposite sides of the second gate structure, wherein the third drain/source region and the fourth drain/source have the concave surfaces.

In accordance with an embodiment, a method comprises epitaxially growing a first semiconductor material in a first portion of a substrate to form a first drain/source region and a second drain/source region, epitaxially growing a second semiconductor material in a second portion of the substrate to form a third drain/source region and a fourth drain/source region, wherein the first portion and the second portion are separated by an isolation region, applying an etching process to top surfaces of the first drain/source region, the second drain/source region, the third drain/source region and the fourth drain/source region and forming a first recess in the first drain/source region, a second recess in the second drain source region, a third recess in the third drain/source region and a fourth recess in the fourth drain/source region as a result of the etching process.

The method further comprises forming a first drain/source contact, a second drain/source contact, a third drain/source contact and a fourth drain/source contact, wherein a bottom portion of the first drain/source contact is in the first recess, a bottom portion of the second drain/source contact is in the second recess, a bottom portion of the third drain/source contact is in the third recess and a bottom portion of the fourth drain/source contact is in the fourth recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
epitaxially growing a first semiconductor material to form a first drain/source region and a second drain/source region in a semiconductor substrate;
applying a first etching process to top surfaces of the first drain/source region and the second drain/source region and forming a first recess in the first drain/source region and a second recess in the second drain/source region as a result of the first etching process, wherein the first drain/source region and the second drain/source region have concave surfaces as a result of the first etching process; and
forming a first drain/source contact and a second drain/source contact, wherein:
a bottom portion of the first drain/source contact is in the first recess; and
a bottom portion of the second drain/source contact is in the second recess.

2. The method of claim 1, further comprising:
forming a first dislocation plane underlying the first drain/source region; and
forming a second dislocation plane underlying the second drain/source region, wherein the first dislocation plane is in parallel with the second dislocation plane.

3. The method of claim 2, wherein:
prior to the step of epitaxially growing the first semiconductor material, forming a first gate structure over a semiconductor substrate, wherein the first drain/source region and the second drain/source region are on opposite sides of the first gate structure.

4. The method of claim 3, further comprising:
forming a second gate structure over a semiconductor substrate;
epitaxially growing a second semiconductor material to form a third drain/source region and a fourth drain/source region in the semiconductor substrate, wherein the third drain/source region and the fourth drain/source region are on opposite sides of the second gate structure; and
applying the first etching process to top surfaces of the third drain/source region and the fourth drain/source region and forming recessed top surfaces of the third drain/source region and the fourth drain/source region as a result of the first etching process.

5. The method of claim 4, wherein:
the first drain/source region, the second drain/source region and the first gate structure form an n-type transistor; and
the third drain/source region, the fourth drain/source region and the second gate structure form a p-type transistor.

6. The method of claim 1, wherein:
the first recess and the second recess are formed in comprise middle-of-line (MEOL) processes performed after a front-end-of line (FEOL) process and before a back-end-of-line (BEOL) process.

7. The method of claim 1, wherein:
a depth of the first recess is in a range from about 5 nm to about 25 nm; and
a depth of the second recess is in a range from about 5 nm to about 25 nm.

8. A method comprising:
epitaxially growing a first semiconductor material in a first portion of a substrate to form a first drain/source region and a second drain/source region;
epitaxially growing a second semiconductor material in a second portion of the substrate to form a third drain/source region and a fourth drain/source region, wherein the first portion and the second portion are separated by an isolation region;
applying an etching process to top surfaces of the first drain/source region, the second drain/source region, the third drain/source region and the fourth drain/source region and forming a first recess in the first drain/source region, a second recess in the second drain/source region, a third recess in the third drain/source region and a fourth recess in the fourth drain/source region as a result of the etching process, wherein the first drain/source region, the second drain/source region, the third drain/source region and the fourth drain/source region have concave surfaces as a result of the etching process; and
forming a first drain/source contact, a second drain/source contact, a third drain/source contact and a fourth drain/source contact, wherein:
a bottom portion of the first drain/source contact is in the first recess;
a bottom portion of the second drain/source contact is in the second recess;
a bottom portion of the third drain/source contact is in the third recess; and
a bottom portion of the fourth drain/source contact is in the fourth recess.

9. The method of claim 8, further comprising:
forming a first gate structure and a second gate structure over the substrate, wherein:
the first drain/source region and the second drain/source region are on opposite sides of the first gate structure; and
the third drain/source region and the fourth drain/source region are on opposite sides of the second gate structure.

10. The method of claim 9, wherein:
the first drain/source region, the second drain/source region and the first gate structure form an n-type transistor; and
the third drain/source region, the fourth drain/source region and the second gate structure form a p-type transistor.

11. The method of claim 10, further comprising:
forming a first trench and a second trench in the first portion of the substrate, wherein the first trench and the second trench are on opposite sides of the first gate structure;
applying a pre-amorphous implantation process to the first portion of the substrate;
depositing a first tensile film layer on sidewalls and bottoms of the first trench and the second trench; and
forming a first dislocation plane underlying the first trench and a second dislocation plane underlying the second trench using an anneal process.

12. The method of claim 8, wherein:
bottoms of the first recess, the second recess, the third recess and the fourth recess are of a concave surface.

13. The method of claim 8, wherein:
the first semiconductor material is silicon; and
the second semiconductor material is silicon germanium.

14. A method comprising:
epitaxially growing a first semiconductor material in a substrate to form a first drain/source region and a second drain/source region, wherein top surfaces of the first drain/source region and the second drain/source region are level with top surface of the substrate;
epitaxially growing a second semiconductor material in the substrate to form a third drain/source region and a fourth drain/source region, wherein top surfaces of the third drain/source region and the fourth drain/source region are level with top surface of the substrate;
applying an etching process to top surfaces of the first drain/source region, the second drain/source region, the third drain/source region and the fourth drain/source region, wherein as a result of the etching process, the first drain/source region, the second drain/source region, the third drain/source region and the fourth drain/source region have concave surfaces; and
forming a first drain/source contact, a second drain/source contact, a third drain/source contact and a fourth drain/source contact connected to the first drain/source region, the second drain/source region, the third drain/source region and the fourth drain/source region and the fourth drain/source region respectively, wherein at least a portion of each drain/source contact is below the top surface of the substrate.

15. The method of claim 14, wherein:
the first drain/source region and the second drain/source region form an n-type transistor; and
the third drain/source region and the fourth drain/source region form a p-type transistor.

16. The method of claim 14, further comprising:
forming a first trench and a second trench on opposite sides of a first gate structure;
depositing an oxide layer over the first trench, the second trench, the first gate structure and a second gate structure;
depositing a photoresist layer; and
removing the photoresist layer over the first trench, the second trench and the first gate structure.

17. The method of claim 16, further comprising:
after the step of removing the photoresist layer, applying a pre-amorphous implantation process to the first trench and the second trench, wherein as a result of applying the pre-amorphous implantation process, a plurality of structurally amorphous structures are formed under the first trench and the second trench;
forming a tensile film layer over the oxide layer; and
applying an anneal process to form a first dislocation plane under the first trench and a second dislocation plane under the second trench.

18. The method of claim 17, wherein:
the first dislocation plane and the second dislocation plane are parallel to each other.

19. The method of claim 17, further comprising:
removing the oxide layer after forming the first dislocation plane and the second dislocation plane.

20. The method of claim 14, wherein:
a width of an area occupied by the first drain/source contact is about 50% of a width of a top surface of the first drain/source region.

\* \* \* \* \*